(12) United States Patent
Chen

(10) Patent No.: US 12,165,972 B2
(45) Date of Patent: *Dec. 10, 2024

(54) METHOD OF MANUFACTURING CONDUCTIVE LINES IN A CIRCUIT

(71) Applicant: TAIWAN SEMICONDUCTOR MANUFACTURING COMPANY, LTD., Hsinchu (TW)

(72) Inventor: Chung-Hui Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 486 days.

This patent is subject to a terminal disclaimer.

(21) Appl. No.: 17/412,872

(22) Filed: Aug. 26, 2021

(65) Prior Publication Data

US 2021/0390217 A1 Dec. 16, 2021

Related U.S. Application Data

(60) Division of application No. 16/518,596, filed on Jul. 22, 2019, now Pat. No. 11,106,835, which is a
(Continued)

(51) Int. Cl.
*H01L 23/528* (2006.01)
*G06F 30/00* (2020.01)
(Continued)

(52) U.S. Cl.
CPC ............ *H01L 23/528* (2013.01); *G06F 30/00* (2020.01); *G06F 30/394* (2020.01);
(Continued)

(58) Field of Classification Search
CPC .............. H01L 23/528; H01L 21/0337; H01L 21/31144; H01L 21/76816;
(Continued)

(56) References Cited

U.S. PATENT DOCUMENTS

| 6,038,383 A | 3/2000 | Young et al. |
|---|---|---|
| 7,999,393 B2 | 8/2011 | Endo et al. |

(Continued)

FOREIGN PATENT DOCUMENTS

| KR | 10-0542533 | 1/2006 |
|---|---|---|
| KR | 10-2009-0084758 | 8/2009 |
| KR | 10-1016826 | 2/2011 |

OTHER PUBLICATIONS

Office Action dated Mar. 2, 2016 and English translation from corresponding application No. KR 10-2015-0069896.
(Continued)

*Primary Examiner* — Caleen O Sullivan
(74) *Attorney, Agent, or Firm* — Hauptman Ham, LLP

(57) ABSTRACT

A method includes identifying at least a first mask or a second mask, fabricating, by the first mask, a first conductive line, fabricating, by the second mask, a second conductive line, and fabricating, by the first mask, a third conductive line if a dimension of the first conductive line is larger than a corresponding dimension of the second conductive line, or fabricating, by the second mask, the third conductive line if the dimension of the first conductive line is less than the corresponding dimension of the second conductive line A first circuit element is coupled to a second circuit element by at least the third conductive line, and the first circuit element is separated from the second circuit element by a predetermined distance.

20 Claims, 25 Drawing Sheets

Related U.S. Application Data continuation of application No. 15/714,543, filed on Sep. 25, 2017, now Pat. No. 10,360,314, which is a continuation of application No. 14/709,938, filed on May 12, 2015, now Pat. No. 9,773,076.

(60) Provisional application No. 62/000,317, filed on May 19, 2014.

(51) Int. Cl.
  G06F 30/394 (2020.01)
  H01L 21/033 (2006.01)
  H01L 21/311 (2006.01)
  H01L 21/768 (2006.01)
  H01L 27/02 (2006.01)
  H01L 27/118 (2006.01)

(52) U.S. Cl.
  CPC .... H01L 21/0337 (2013.01); H01L 21/31144 (2013.01); H01L 21/76816 (2013.01); H01L 21/76838 (2013.01); *H01L 27/0207* (2013.01); *H01L 2027/11875* (2013.01); *H01L 2924/0002* (2013.01)

(58) Field of Classification Search
  CPC ........... H01L 21/76838; H01L 27/0207; H01L 2027/11875; H01L 2924/0002; H01L 2924/00; G06F 30/00; G06F 30/394
  USPC ....................................................... 438/618
  See application file for complete search history.

(56) References Cited

U.S. PATENT DOCUMENTS

| | | |
|---|---|---|
| 8,601,416 B2 | 12/2013 | Kuo et al. |
| 8,762,900 B2 | 6/2014 | Shin et al. |
| 8,775,993 B2 | 7/2014 | Huang et al. |
| 8,887,116 B2 | 11/2014 | Ho et al. |
| 10,360,314 B2 * | 7/2019 | Chen ................. H01L 21/76838 |
| 2002/0022311 A1 | 2/2002 | Takeuchi et al. |
| 2004/0031010 A1 | 2/2004 | Kaida |
| 2008/0169862 A1 | 7/2008 | Park et al. |
| 2008/0303776 A1 | 12/2008 | Jung |
| 2010/0207248 A1 | 8/2010 | Park |
| 2011/0053096 A1 | 3/2011 | Yu et al. |
| 2013/0049211 A1 | 2/2013 | Eom |
| 2014/0101623 A1 | 4/2014 | Chen et al. |
| 2014/0201692 A1 | 7/2014 | Chen et al. |
| 2014/0237435 A1 | 8/2014 | Chen et al. |
| 2014/0282337 A1 | 9/2014 | Yuh et al. |
| 2014/0304670 A1 | 10/2014 | Su et al. |
| 2014/0310675 A1 | 10/2014 | Liu et al. |
| 2014/0325464 A1 | 10/2014 | Hsu et al. |

OTHER PUBLICATIONS

Notice of Allowance dated Sep. 19, 2016 and English translation from corresponding application No. KR 10-2015-0069896.

\* cited by examiner

1500

1510

Identify a first mask and a second mask

1520

The first mask is used to form a third conductive line if a width of the first conductive line is larger than a width of the second conductive line or the second mask is used to form the third conductive line if the width of the second conductive line is large than the width of the first conductive line

Fig. 15

METHOD OF MANUFACTURING CONDUCTIVE LINES IN A CIRCUIT

PRIORITY CLAIM

The present application is a divisional of U.S. application Ser. No. 16/518,596, filed Jul. 22, 2019, now U.S. Pat. No. 11,106,835, issued Aug. 31, 2021, which is a continuation of U.S. application Ser. No. 15/714,543, filed Sep. 25, 2017, now U.S. Pat. No. 10,360,314, issued Jul. 23, 2019, which is a continuation of U.S. application Ser. No. 14/709,938, filed May 12, 2015, now U.S. Pat. No. 9,773,076, issued Sep. 26, 2017, which claims the priority of U.S. Provisional Application No. 62/000,317, filed May 19, 2014, which are incorporated herein by reference in their entireties.

BACKGROUND

In multi-patterning technologies (MPT), multiple masks are used in succession to form conductive or metal lines. For example, in a double-pattering technology (DPT), two masks are used. In a triple-pattering technology, three masks are used, etc. In forming the conductive lines, each mask corresponds to a set of conductive lines. Because of different masks and different ways to form different sets of conductive lines, a width of conductive lines in a particular set of conductive lines is different from a width of conductive lines in another set of conductive lines. Different widths in turn result in different electrical behaviors of circuits using the corresponding conductive lines.

BRIEF DESCRIPTION OF THE DRAWINGS

The details of one or more embodiments of the disclosure are set forth in the accompanying drawings and the description below. Other features and advantages will be apparent from the description, drawings, and claims.

FIG. 15 is a flowchart illustrating a method of forming conductive lines, in accordance with some embodiments.

Like reference symbols in the various drawings indicate like elements.

DETAILED DESCRIPTION

Figure 1:
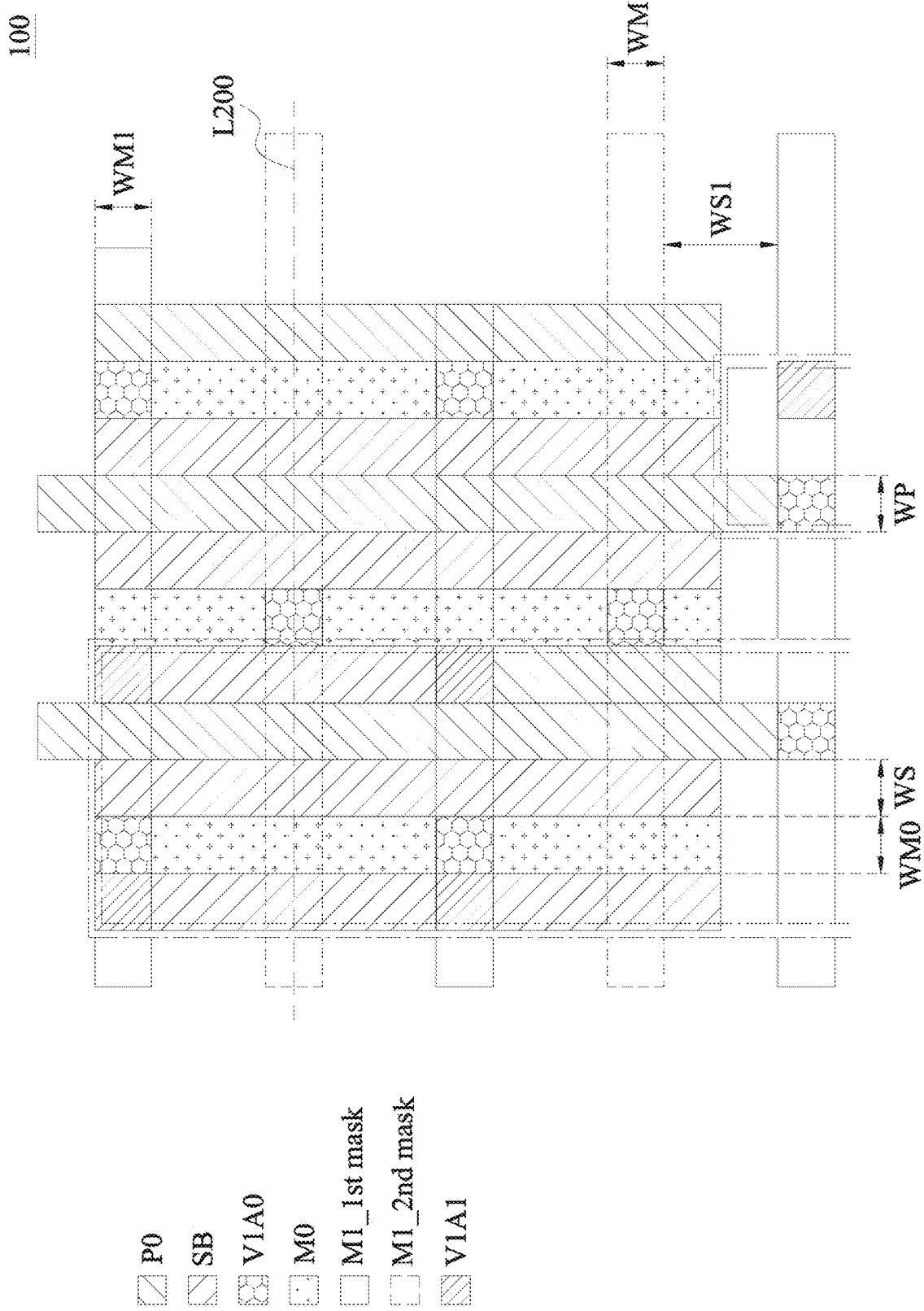
FIG. 1 is a layout diagram of a semiconductor structure, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments of the present disclosure have one or a combination of the following features and/or advantages. In some embodiments regarding double patterning including self-aligned double patterning (SADP), two masks are used in succession to form conductive lines. A first mask is used to form a first set of conductive lines and a second succeeding mask is used to form a second set of conductive lines. Both sets of conductive lines are used as signal traces for electrical circuits. In some embodiments, conductive lines formed based on the first mask have a width smaller than a width of conductive lines formed based on the second mask. In some embodiments, conductive lines formed based on the second mask have lower resistivity than resistivity of the same conductive lines if the same conductive lines are formed based on the first mask. In some embodiments, when the width of a conductive line increases, capacitive of the conductive line also increases. However, the resistive-capacitive (RC) constant of the conductive line decreases because the decrease in resistivity is more than the increase in capacitive. Consequently, the RC constant of a conductive line formed based on the second mask is smaller than that of the same conductive line if the same conductive line is formed based on the first mask.

In some embodiments, the second mask is used to form long conductive lines. For example, in some embodiments regarding an inverter ring having multiple inverters connected in series, a conductive line from an output of a preceding inverter to an input of a succeeding inverter is considered long. Further, a conductive line from an output of the last inverter in the series of inverters to an input of the first inverter in the series of inverters is also considered long. Because long conductive lines are formed by the second mask, the long conductive lines have a wider width and lower resistivity than those of the same conductive lines if the same conductive lines are formed by the first mask. Performance of electrical circuits using the long conductive lines therefore improves.

In some embodiments, a conductive line is considered long based on one or a combination of different factors. For example, in some embodiments, the conductive line is considered long based on a channel width of a transistor, such as at least five times the channel width of a transistor. In some embodiments, a channel width of a transistor is in a range of 10 nm to 20 µm. For another example, for a particular technology node such as 20 nm, 16 nm, 14 nm, etc., a conductive line is considered long based on at least one of a predetermined width of a metal or conductive structure of that particular node, a predetermined width of a poly structure, a predetermined width between a poly structure and a metal structure, a predetermined width between two metal structures, etc. For illustration, each of the predetermined width of a conductive structure, the predetermined width of a poly structure, the predetermined width between a poly structure and a metal structure, and the predetermined width between two metal structures is called a distance unit. In some embodiments, the second mask is used to form a conductive line between a drain and a drain, a drain and a source, a source and a source of a first transistor and a second transistor when the resulting conductive line is longer than a certain number of distance units, such as five distance units, and is predetermined. In some embodiments, a conductive line is considered long if the conductive line is at least 5 µm.

In some embodiments, a conductive line is considered long based on whether the conductive line is within a semiconductor structure or extends across different semiconductor structures wherein a distance between two semiconductor structures is over a predetermined number of distance units, for example.

In some embodiments, a first conductive line is formed to have a width wider than that of a second conductive line when the first conductive line is to carry a first current larger than a second current of the second conductive line. For example, the first conductive line is formed by mask M20 in FIG. 13F and the second conductive line is formed by mask M10 in FIG. 13B.

In some embodiments, when a first circuit is similar to a second circuit, conductive lines in the first circuit are formed by the same mask used to form conductive lines in the second circuit. For example, a current mirror includes circuits in a first branch that are similar to circuits in a second branch. In some embodiments, conductive lines in circuits in the first branch are formed by the same mask used to form conductive lines in circuits in the second branch. Because conductive lines in circuits in the first branch and conductive lines in circuits in the second branch are formed by the same mask, a first current in circuits in the first branch is similar to a second current in circuits in the second branch. Consequently, electrical performance of the current mirror improves, compared with a situation in which conductive lines in circuits in the first branch are formed by a mask different from another mask used to form conductive lines in circuits in the second branch. For illustration regarding approaches that are different from various embodiments of the present disclosure, long conductive lines of circuits in the first branch are formed by the first mask while long conductive lines of circuits in the second branch are formed by the second mask. In those approaches, because resistivity of long conductive lines of circuits in the first branch are different from resistivity of long conductive lines of circuits in the second branch, currents in circuits in the first branch are different from circuits in the second branch, which significantly affects performance of the current mirror. An increased frequency is an example of improved electrical performance. For example, in various embodiments of the present disclosure, the current mirror operates at a frequency higher than a frequency of another current mirror in which conductive lines in circuits in the first branch are formed by a mask different from another mask used to form conductive lines in circuits in the second branch.

In this document regarding double patterning including self-aligned double patterning (SADP) two masks are used in succession. A first mask and a second mask of the two masks are used to form a corresponding smaller width and larger width for a same conductive line. Unless otherwise stated, a long conductive line is formed by a mask that produces conductive lines having the larger width. As a result, resistivity of the long conductive line is lower than resistivity of the same conductive line if the same conductive line were formed by the mask that provides a smaller width. Various factors to determine whether a conductive line is long are discussed throughout this document.

Exemplary Long Conductive Lines

Figure 2:
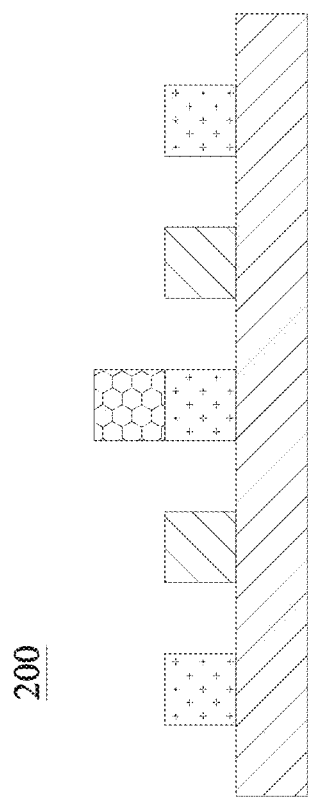
FIG. 2 is a cross-section diagram of the semiconductor structure in FIG. 1, in accordance with some embodiments.

FIG. 1 is a layout diagram of a semiconductor structure 100, in accordance with some embodiments. FIG. 2 is a cross section diagram 200 at line L200 of semiconductor structure 100, in accordance with some embodiments. Labels for different sub-structures of semiconductor structure 100 are illustratively provided in FIG. 1.

Semiconductor structure 100 is used to form different electrical devices, including transistors, for example. As illustratively shown in FIGS. 1 and 2, structure 100 includes a substrate SB, two poly structures PO, a metal layer M0 having three metal strips, eight vias VIA0, five vias VIA1, a metal line in metal layer M1 formed by a first mask, and a metal line in metal layer M1 formed by a second mask. A metal strip is also called a metal structure. Various other semiconductor structures different from semiconductor structure 100 are within the contemplated scope of the present disclosure.

A region or a portion of a poly structure PO is used to form a gate of a transistor. An oxide diffusion (OD) region or a portion of substrate SB is used to form a drain or a source of a transistor. Vias VIA0 are used to connect electrical components in metal layer M0 to metal layer M1. Vias VIA1 are used to connect electrical components in metal layer M1 to metal layer M2. In various embodiments of the present disclosure, a source of a transistor functions as a drain and vice versa. Semiconductor 100 is of a fin field effect transistor (FinFET) type, but planar or other technologies are within the contemplated scope of the present disclosure.

A width WM0 indicates a width of a metal strip M0 in metal M0 layer. A width WM11 indicates a width of a metal strip in a metal M1 layer formed by a first mask, such as mask M10 in FIG. 13B. A width WM12 indicates a width of a metal strip in a metal M1 layer formed by a second mask, such as mask M20 in FIG. 13F. A width WS1 indicates a distance between two metal strips in a metal M1 layer. A width WS indicates a distance between a metal strip M0 to a poly structure PO. A width WP indicates a width of a poly structure PO. In some embodiments, a width WP is proportional to a channel length of a transistor. For example, a transistor having a larger channel length has a larger width WP, and vice versa. Two similar currents of two transistors having two larger widths WP have a lower mismatch than the same two similar currents of the same two transistors having two smaller widths WP. In some embodiments, to reduce current mismatch in similar circuits with similar transistors, poly structures PO having larger widths WP are used. Transistors in a circuit that are formed by the same or different widths WP are within the contemplated scope of the disclosure. In some embodiments, width WP is equal to or greater than each of width WM0, WM11, or WM12. In some embodiments, widths WM0, WM11, and WM12 are of a same size, but widths WM0, WM11, and WM12 are of different sizes in other embodiments.

For illustration, each of widths WM0, WS, WP, WS1, WM11, WM12 is called a distance unit, and is used to determine whether a conductive line is long or not. For example, in some embodiments, a conductive line is considered long if the conductive line is at least five distance units. In some embodiments, the smallest width among the widths is used as the distance unit. Five distance units are used as an example. Another number of distance units are within the contemplated scope of the disclosures. Various ways to determine whether a conductive line is long is within the contemplated scope of the disclosure.

Figure 3:
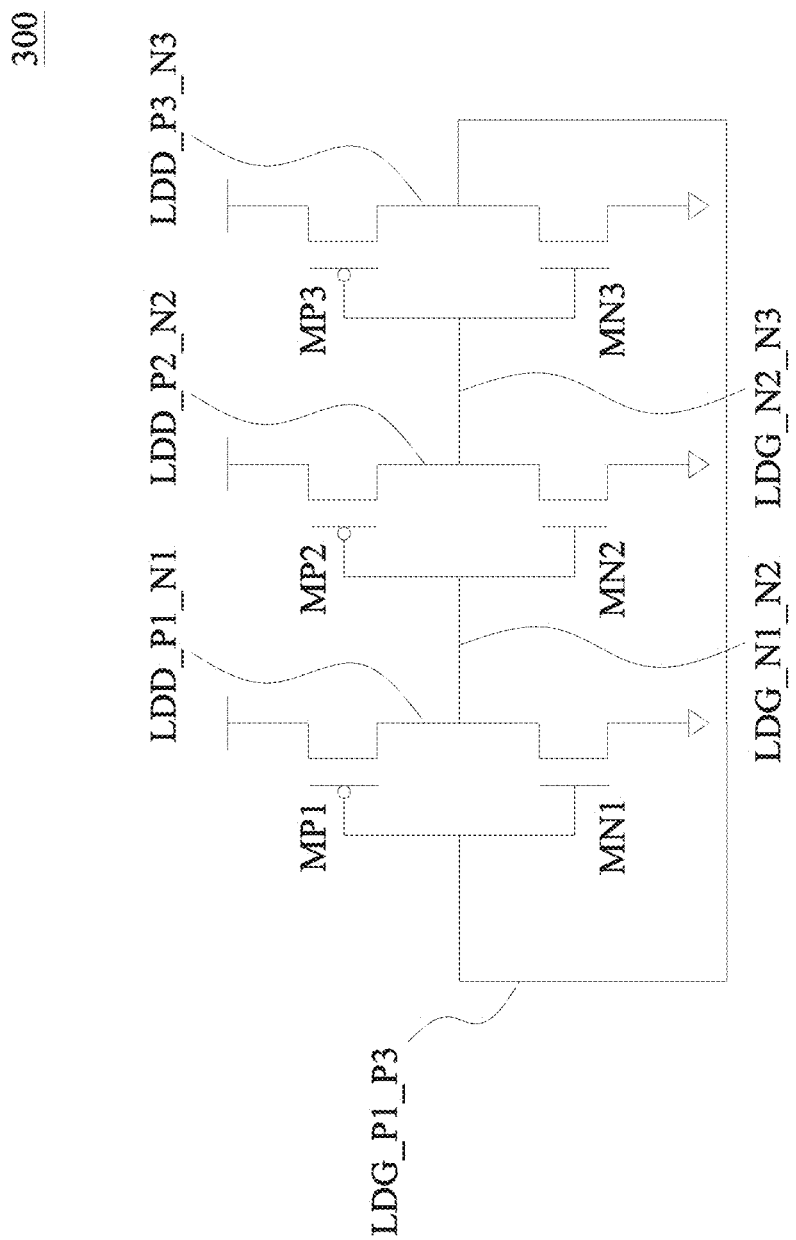
FIG. 3 is a circuit diagram of an exemplary inverter ring built based on various semiconductor structures in FIG. 1, in accordance with some embodiments.

FIG. 3 is a diagram of a circuit 300, in accordance with some embodiments. Circuit 300 is an inverter ring that includes three inverters connected in series. The first inverter is formed by a PMOS transistor MP1 and an NMOS transistor MN1. The second inverter is formed by a PMOS transistor MP2 and an NMOS transistor MN2, and the third inverter is formed by a PMOS transistor MP3 and an NMOS transistor MN3. An output of the first inverter is coupled with an input of the second inverter. An output of the second inverter is coupled with an input of the third inverter, and an output of the third inverter is coupled with an input of the first inverter.

Figure 13A:
FIGS. 13A-K are diagrams used to illustration formation of conductive lines in various circuits, in accordance with some embodiments.
Figure 13B:
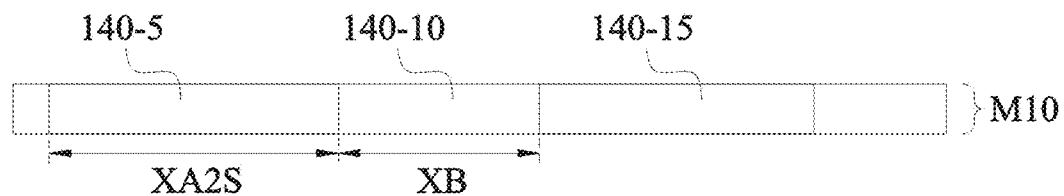
Figure 13C:
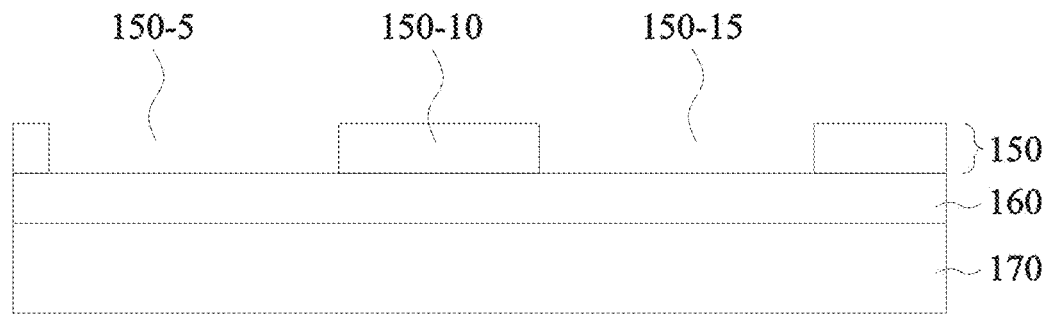
Figure 13D:
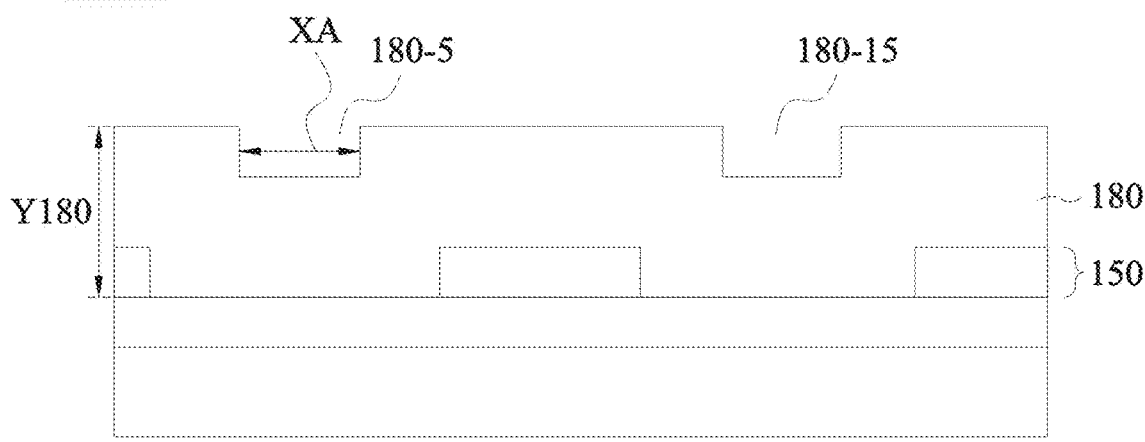
Figure 13E:
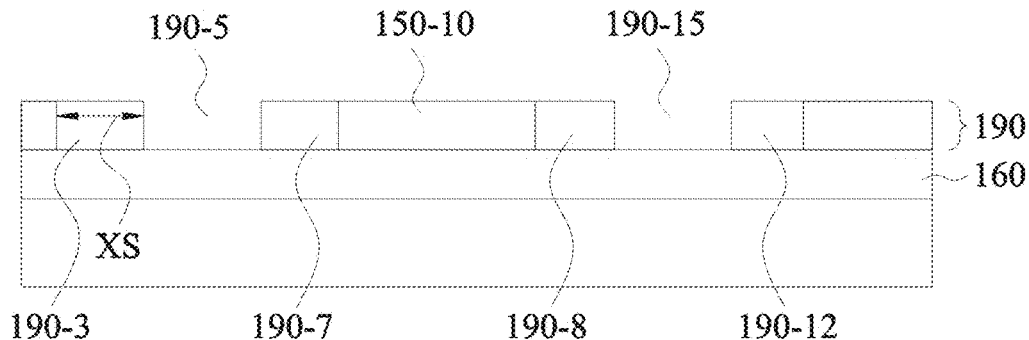
Figure 13F:
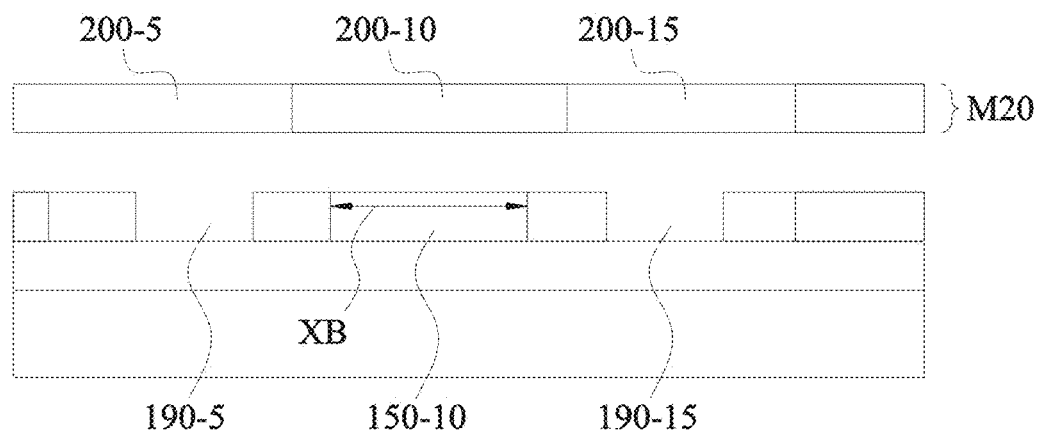

In various embodiments, a conductive line LDD_P1_N1 between the drain of transistor MP1 and the drain of transistor MN1 is considered long, and is formed by a second mask, such as a mask M20 in FIG. 13F. Similarly, a conductive line LDD_P2_N2 between the drain of transistor MP2 and the drain of transistor MN2 and a conductive line LDD_P3_N3 between the drain of transistor MP3 and the drain of transistor MN3 are each considered long, and are each formed by mask M20.

Additionally, conductive lines LDG_N1_N2, LDG_N2_N3, LGD_P1_P3 are considered long and are formed by mask M20. Conductive line LDG_N1_N2 connects the drain of transistor N1 and the gate of transistor N2. Because the drain of transistor MP1 is coupled to the drain of transistor MN1, and the gate of transistor MP2 is coupled to the gate of transistor MN2, the drains of transistors MP1, MN1, MP2, and MN2 are coupled together by conductive line LDG_N1_N2. Similarly, through conductive line LDG_N2_N3, the drains of transistor MP2, MN2 and the gates of transistors MP3, MN3 are coupled together. Conductive line LGD_P1_P3 connects the gate of transistor P1 and the drain of transistor P3. Because the gate of transistor MP1 is coupled to the gate of transistor MN1, and the drain of transistor MP3 is coupled to the drain of transistor MN3, the gates of transistors MP1, MN1, and the drains of transistor MP3, MN3 are coupled together by conductive line LGD_P1_P3. In various embodiments, conductive lines, including conductive lines LDD_P1_N1, LDG_N1_N2, LDD_P3_N3, etc., are surrounded by dielectric material, such as dielectric material of dielectric lay 170 in FIG. 13C.

Figure 4:
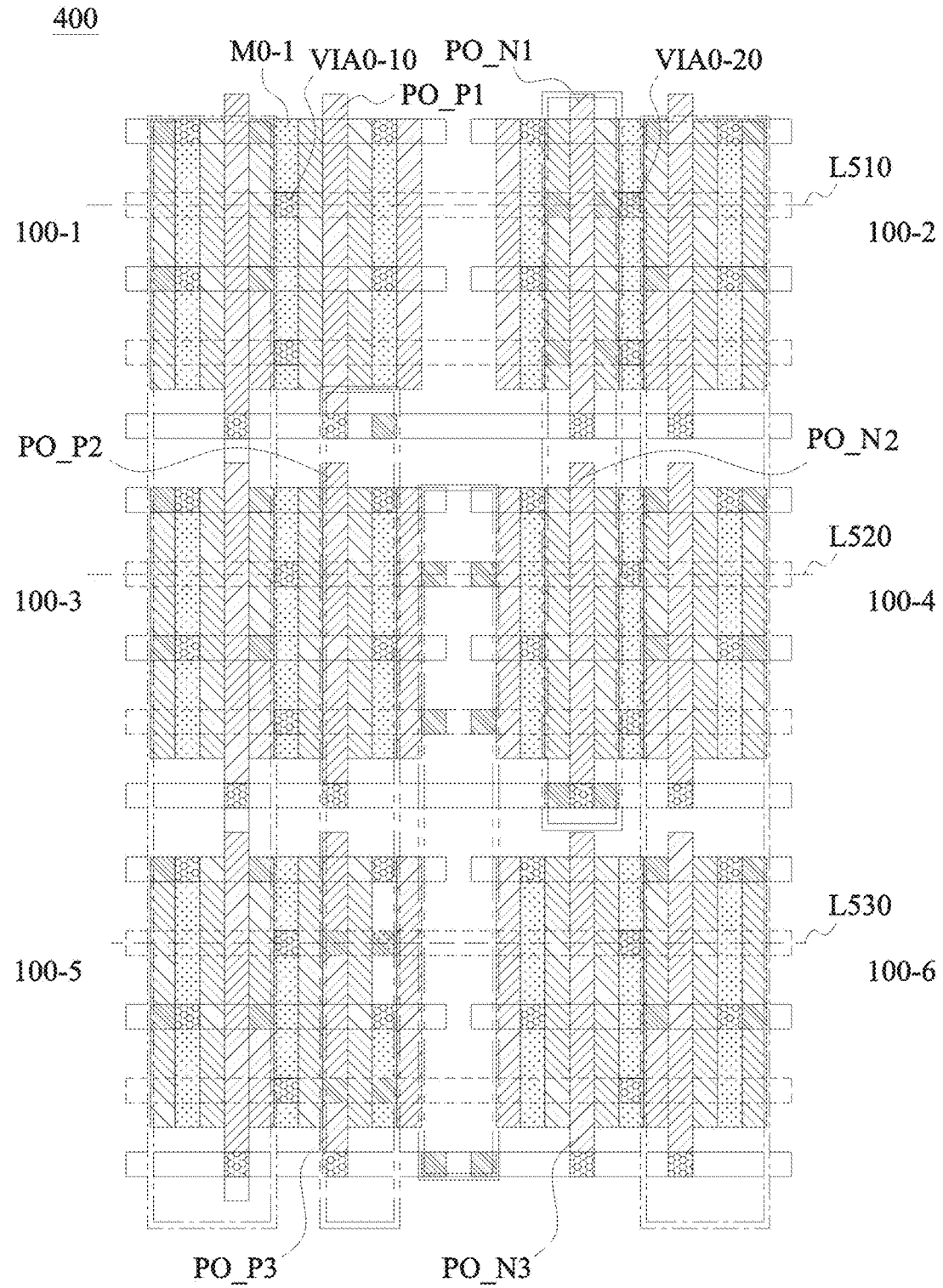
FIG. 4 is a layout of a semiconductor structure used to form the circuit in FIG. 3, in accordance with some embodiments.

FIG. 4 is a layout diagram of a semiconductor structure 400, in accordance with some embodiments. Semiconductor structure 400 includes six semiconductor structures 100-1 to 100-6 that form circuit 300 in FIG. 3. Semiconductor structures 100-1, 100-2, 100-3, 100-4, 100-5, and 100-6 form transistors MP1, MN1, MP2, MN2, MP3, and MN3 in FIG. 3, respectively. Poly structures PO_P1, PO_P2, PO_P3, PO_N1, PO_N2, and PO_N3 are used to form the gates of transistor MP1, MP2, MP3, MN1, MN2, and MN3, respectively. Substrates SB of structures 100-1, 100-2, 100-3, 100-4, 100-5, and 100-6 are called SB-1, SB-2, SB-3, SB-4, SB-5, and SB-6, respectively, but, for simplicity, are not labeled in FIG. 4. Each of substrates SB-1, SB-2, SB-3, SB-4, SB-5, and SB-6 includes OD regions to form the drains and the sources of respective transistors MP1, MP2, MP3, MN1, MN2, and MN3. For simplicity, various elements of transistors MP1, MP2, MP3, MN1, MN2, and MN3 in FIG. 4 and FIG. 5 are not labeled.

Lines L510, L520, and L530 are discussed with reference to FIG. 5.

Figure 5:
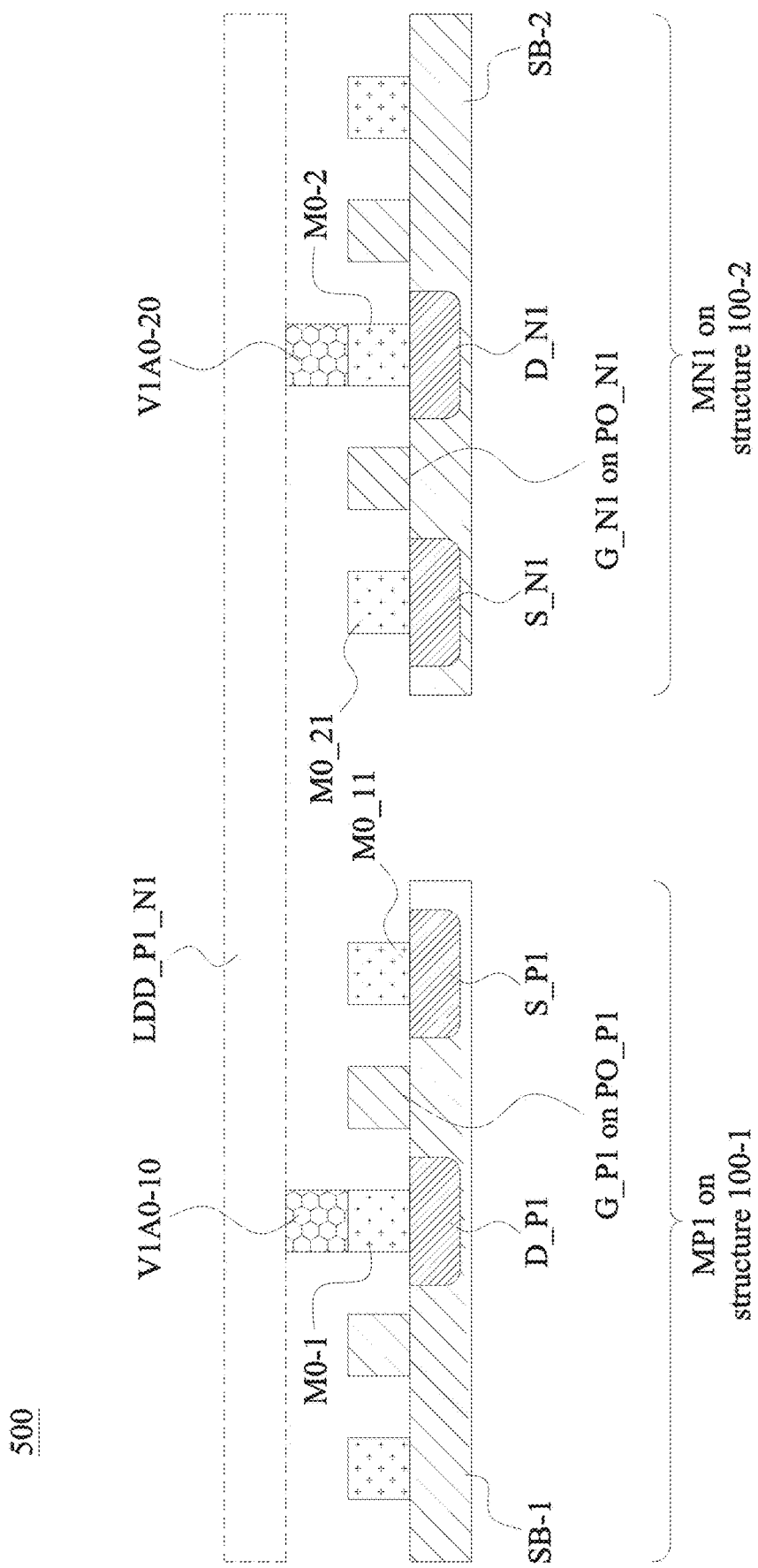
FIG. 5 is a cross-section diagram of the semiconductor structure in FIG. 4, in accordance with some embodiments.

FIG. 5 is a cross-section diagram 500 at line L510 of FIG. 4, in accordance with some embodiments. Cross section diagram 500 is used to illustrate a connection between the drain of transistor MP1 and the drain of transistor MN1 by conductive line LDD_P1_N1.

OD regions S_P1 and D_P1 are parts of substrate SB-1 in FIG. 3. OD region S_P1 forms a source of transistor MP1. OD region D_P1 forms a drain of transistor MP1. Poly region G_P1 on poly structure PO_P1 in FIG. 3 forms a gate of transistor MP1.

OD regions S_N1 and D_N1 are part of substrate SB-2 in FIG. 3. OD region S_N1 forms a source of transistor MN1. OD region D_N1 forms a drain of transistor MN1. Poly region G_N1 on poly structure PO_N1 in FIG. 3 forms a gate of transistor MP1.

As illustratively shown in FIG. 5, drain region D_P1 is electrically coupled with metal piece M0-1, via VIA0-10, conductive line LDD_P1_N1, via VIA0-20, metal piece M0-2 and drain region D_N1. Effectively, conductive line LDD_P1_N1 electrically connects the drain of transistor MP1 and the drain of transistor MN1.

In some embodiments as illustrated in FIGS. 3-5, conductive line LDD_P1_N1 is considered long because conductive line LDD_P1_N1 extends beyond one semiconductor structure. For example, conductive line LDD_P1_N1 extends across semiconductor structure 100-1 and semiconductor structure 100-2. Considered in another way, conductive line LDD_P1_N1 is long because conductive line LDD_P1_N1 is longer than a predetermined length. For example, conductive line LDD_P1_N1 from via VIA0-10 to via VIA0-20 is longer than five distance units because the conductive line from via VIA0-10 to via VIA-20 expands at least the distance units of via VIA0-10, poly region G_P1, metal piece M0-11, metal piece M0-21, and poly region G_N1. Considered in yet another way, conductive line LDD_P1_N1 is long because conductive line LDD_P1_N1 carries a current from the drain of transistor MP1 to the drain of transistor MN1, which is relatively large compared with another current in another part of circuit 300, such as a current between the gate of transistor MP1 and the gate of transistor MN1. In some embodiments, because conductive line LDD_P1_N1 is considered long, conductive line LDD_P1_N1 is formed by a second and succeeding mask M20 in FIG. 13F in a in a self-aligned double patterning (SADP) technology. Other ways to form conductive line LDD_P1_N1 such that a resistivity and/or an RC constant on conductive line LDD_P1_N1 decrease are within the contemplated scope of the present disclosure.

Because of similarities of semiconductor structures 100-1 and 100-2 to corresponding semiconductor structure 100-3 and 100-4, a connection between the drain of transistor P2 and the drain of transistor N2 through conductive line LDD_P2_N2 is similar to the connection between the drain of transistor P1 and the drain of transistor N1 through conductive line LDD_P1_N1. For example, with reference to conductive line LDD_P2_N2, a cross section diagram at line L520 in FIG. 4 is similar to cross section diagram 500 in FIG. 5. Similarly, a connection between the drain of transistor P3 and the drain of transistor N3 through conductive line LDD_P3_N3 is similar to the connection between the drain of transistor P1 and the drain of transistor N1 through conductive line LDD_P1_N1. For example, with reference to conductive line LDD_P3_N3, a cross section diagram at line L530 in FIG. 4 is similar to cross section diagram 500 in FIG. 5.

Figure 6A:
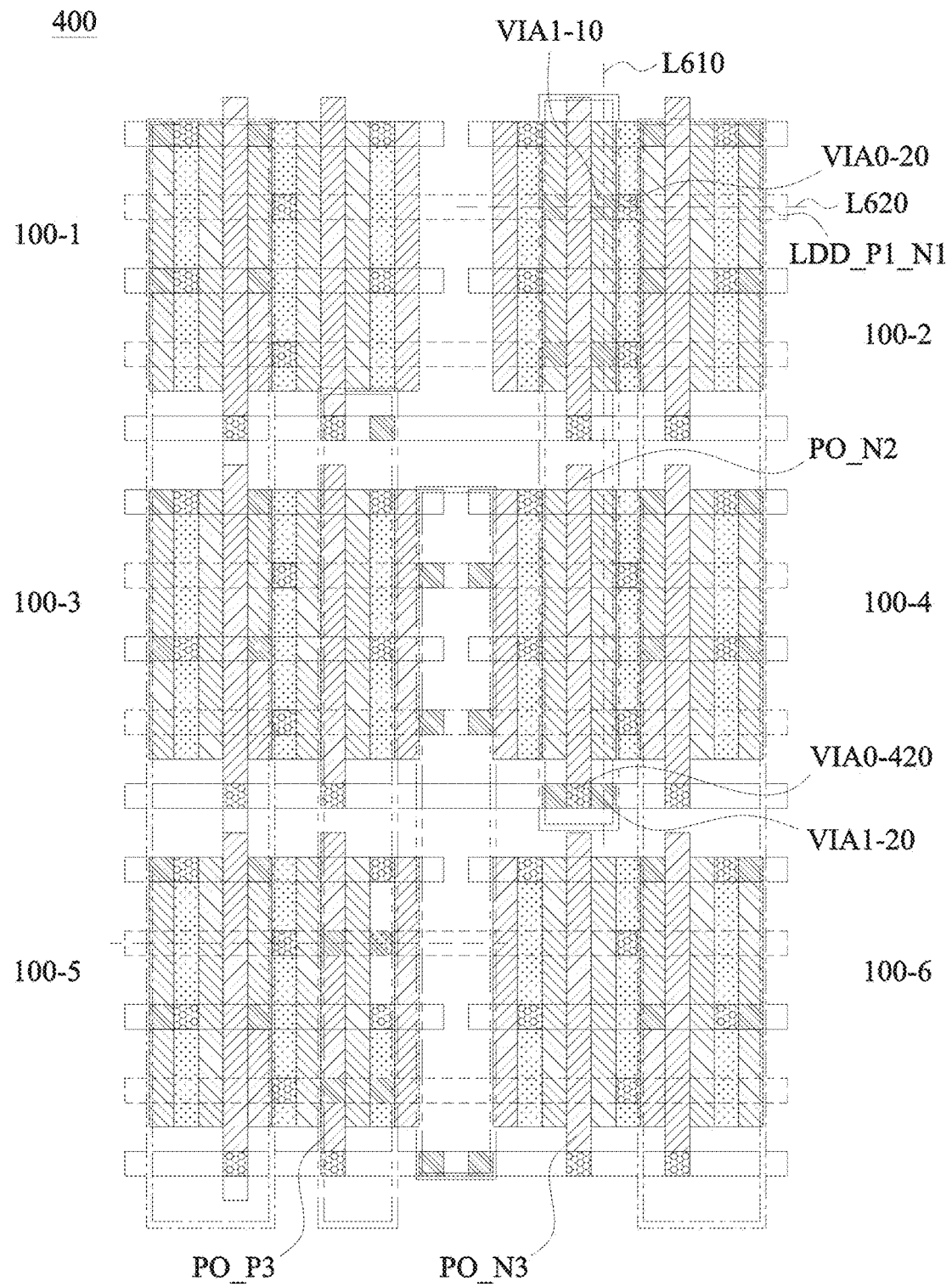
FIG. 6A is the layout in FIG. 4 reproduced having labels related to FIGS. 6B and 6C, in accordance with some embodiments.
Figure 6B:
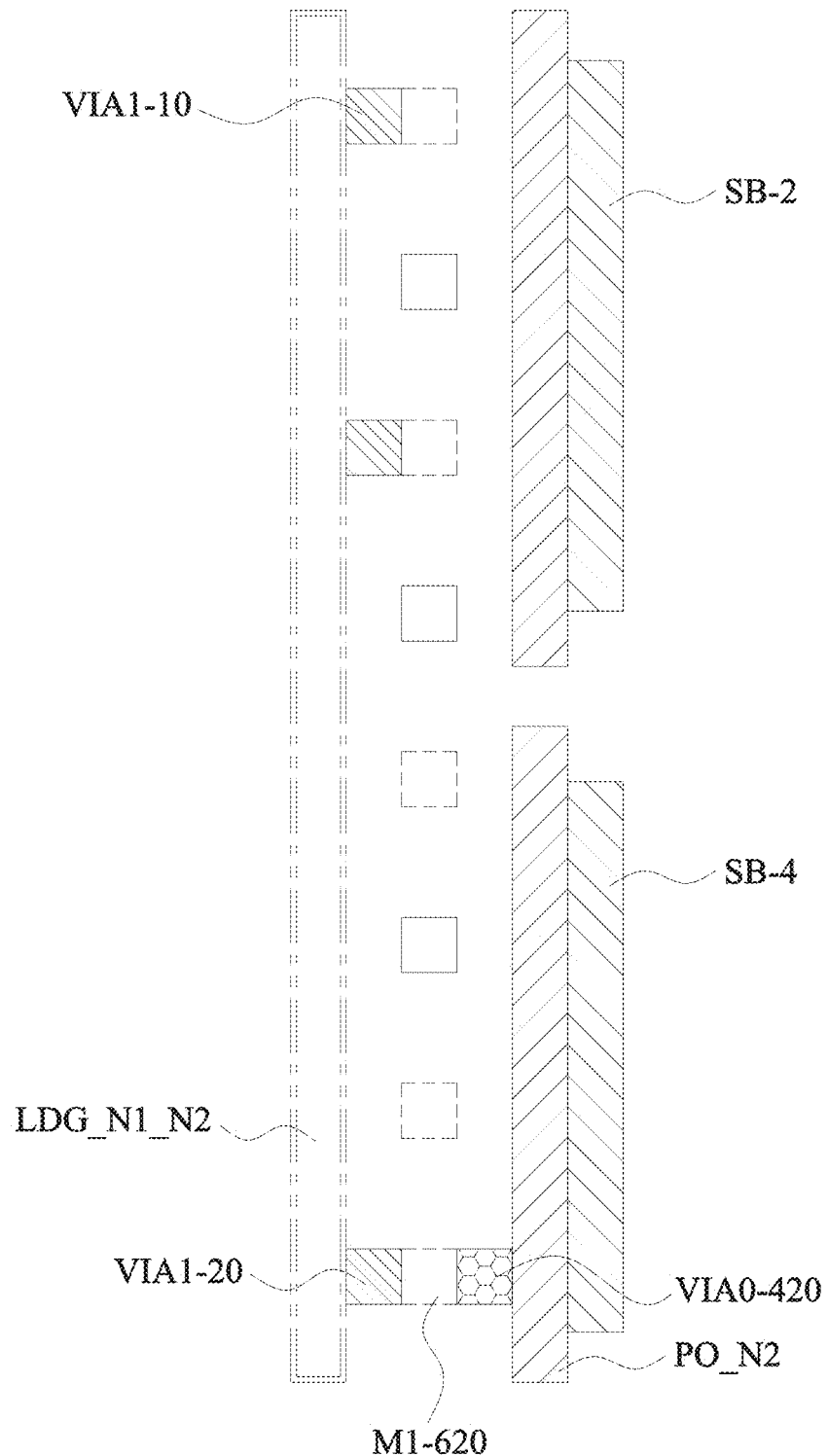
FIG. 6B is a cross-section diagram at a line of the layout in FIG. 6A, in accordance with some embodiments.
Figure 6C:
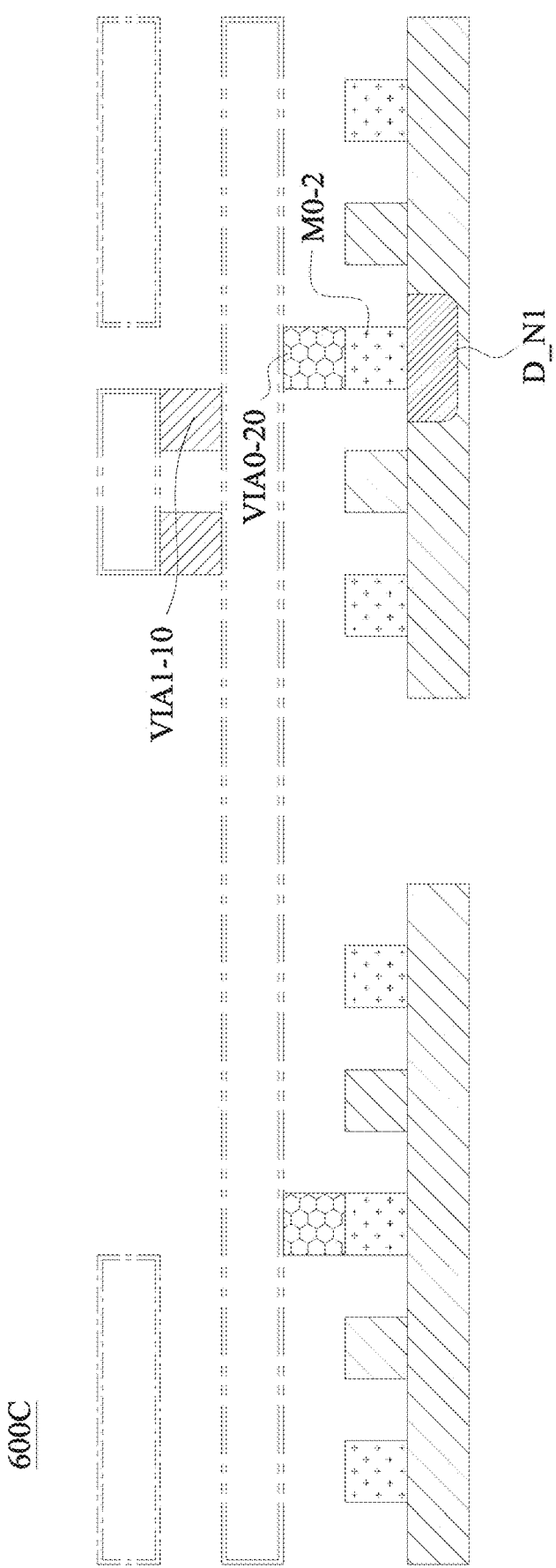
FIG. 6C is a cross-section diagram at another line of the layout in FIG. 6A, in accordance with some embodiments.

FIG. 6A is a layout diagram of semiconductor structure 400 in FIG. 4 reproduced to have labels associated with FIGS. 6B and 6C. FIGS. 6A-6C are used to illustrate a connection between the drain of transistor MN1 and the gate of transistor MN2 by conductive line LDG_N1_N2 shown in FIG. 3.

FIG. 6B is a cross-section diagram 600B at line L610 of FIG. 6A, in accordance with some embodiments. Metal piece M1-620 in FIG. 6B is not visible in FIG. 6A. As illustratively shown in FIG. 6B, conductive line LDG_N1_N2 is connected with vias VIA1-10 and VIA1-20. Via VIA1-20 is coupled with metal piece M1-620, via VIO0-420, and poly PO_N2 that is the gate of transistor MN2. FIG. 6C is a cross-section diagram 600C at line L620 of FIG. 6A. Diagram 600C is used to illustrate a connection between via VIA1-10 and the drain of transistor MN1. As illustratively shown, via VIA1-10 is coupled with conductive line LDD_P1_N1, via VIA0-20, metal piece M0-2, and OD region D_N1 that is the drain of transistor MN1. Effectively, conductive line LDG_N1_N2 connects the drain of transistor MN1 to the gate of transistor MN2.

A connection between the drain of transistor MP1 and the drain of transistor MN1 is illustrated above with reference to FIG. 5. A connection between the gate of transistor MP2 and the gate of transistor MN2 is similar to the connection between the gate of transistor MP1 and the gate of transistor MN1 as illustrated with reference to FIG. 7C. Effectively, conductive line LDG_N1_N2 connects the drains of transistors MP1, MN1 and the gates of transistors MP2, MN2.

A connection between the drains of transistors MP2, MN2 and the gates of transistors MP3, MN3 through conductive line LDG_N2_N3 is similar to the connection between the drains of transistors MP1, MN1 and the gates of transistor MP2, MN2 through conductive line LDG_N1_N2.

In some embodiments, conductive lines LDG_N1_N2, LDG_N2_N3 are considered long based on various factors as described with reference to conductive line LDD_P1_N1. As a result, in some embodiments, conductive lines LDG_N1_N2, LDG_N2_N3 are formed by mask M20.

Figure 7A:
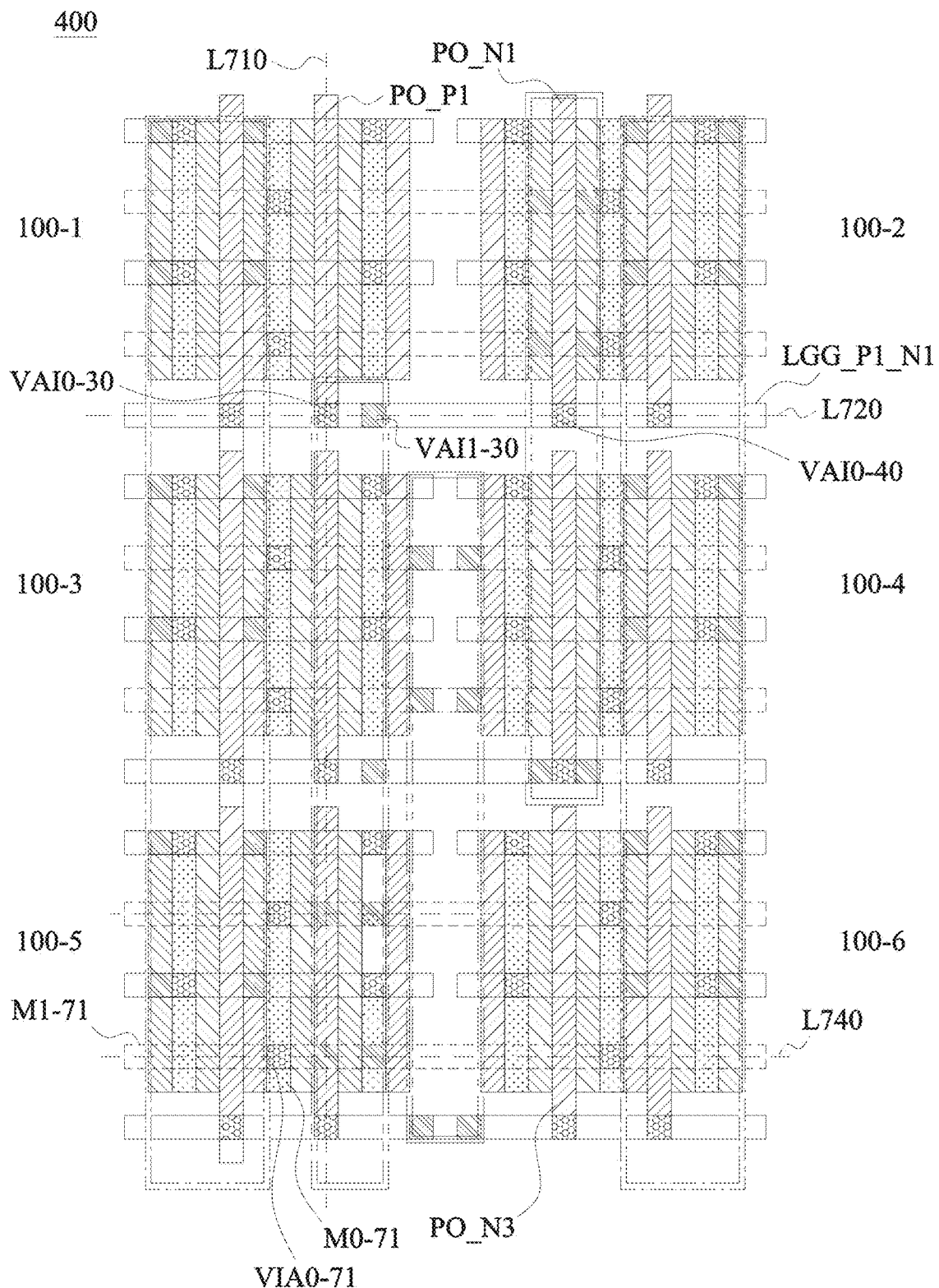
FIG. 7A is the layout in FIG. 4 reproduced having labels related to FIGS. 7B and 7D, in accordance with some embodiments.
Figure 7B:
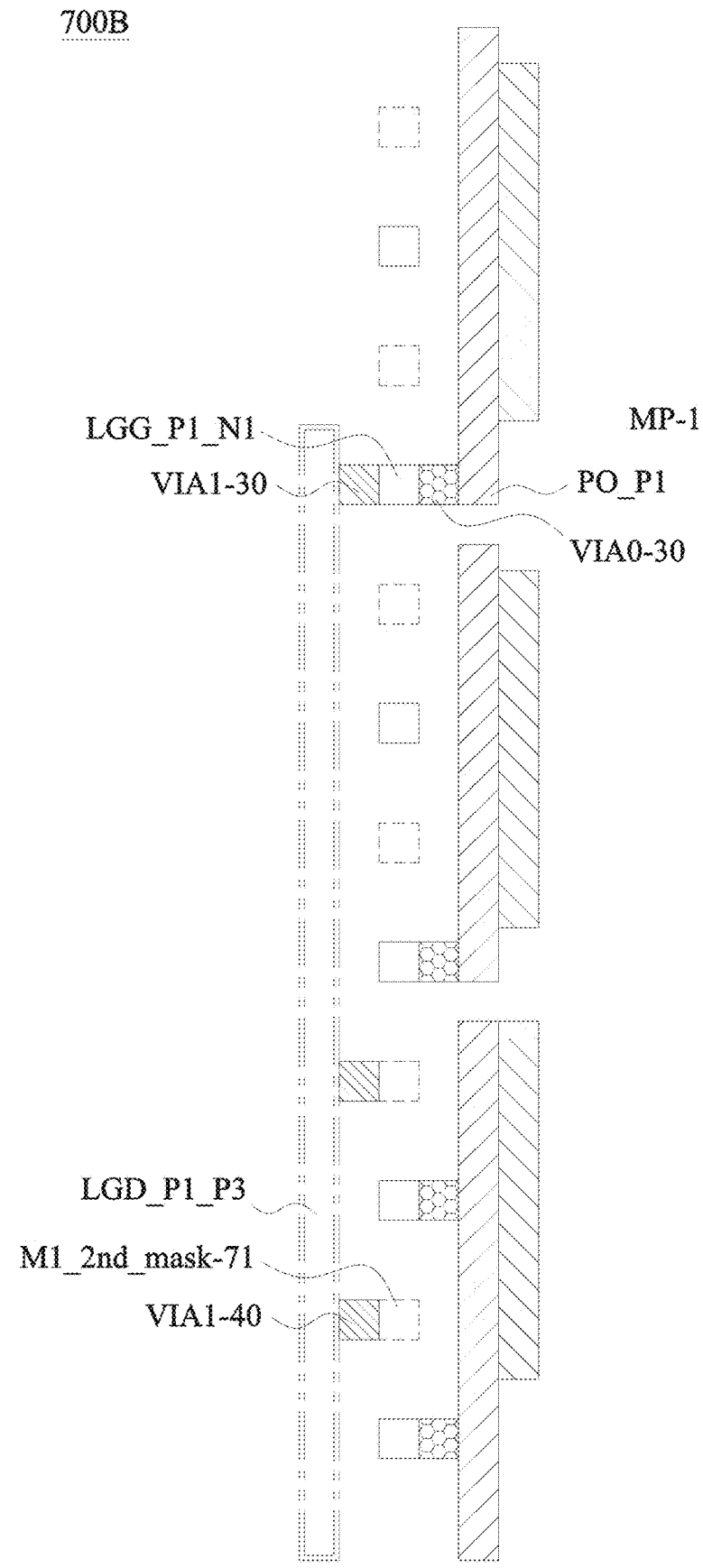
FIG. 7B is a cross-section diagram at a line of the layout in FIG. 7A, in accordance with some embodiments.
Figure 7C:
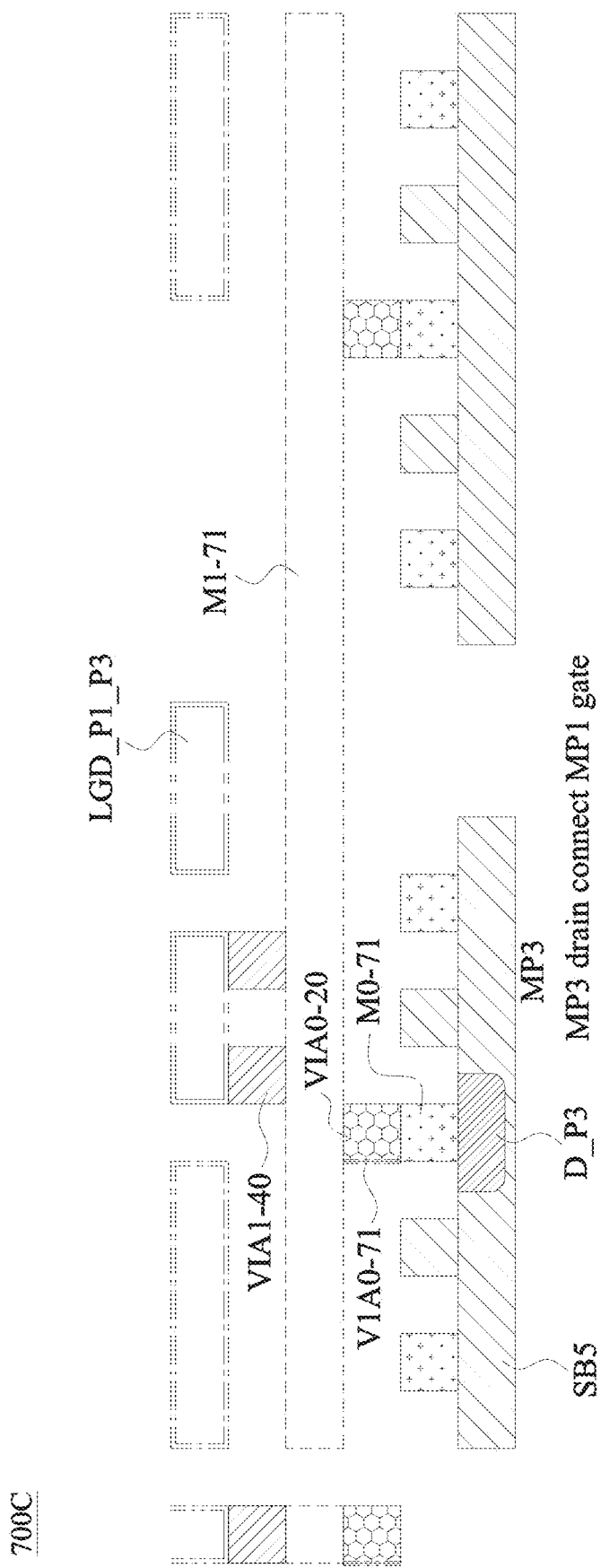
FIG. 7C is a cross-section diagram at another line of the layout in FIG. 7A, in accordance with some embodiments.
Figure 7D:
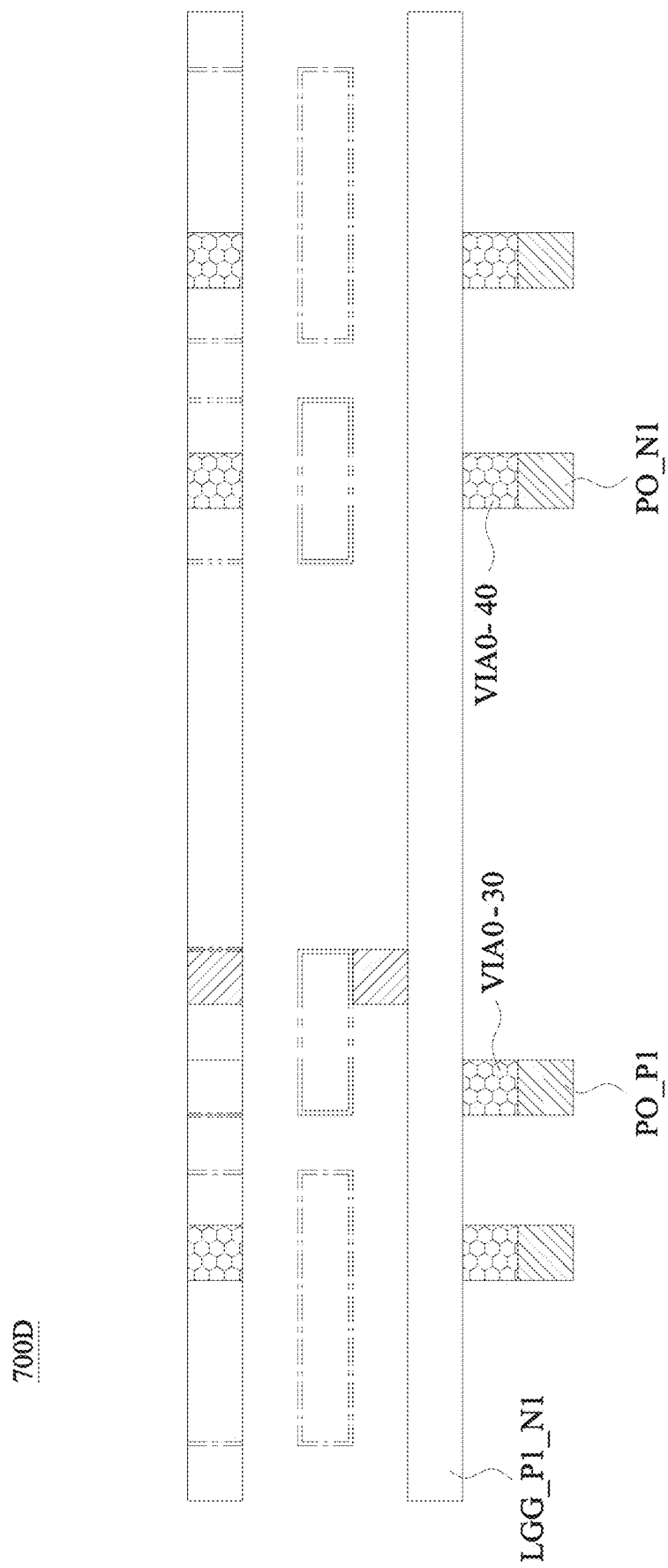
FIG. 7D is a cross-section diagram at yet another line of the layout in FIG. 7A, in accordance with some embodiments.

FIG. 7A is a layout diagram of semiconductor structure 400 reproduced having labels related FIGS. 7B, 7C, and 7D. FIGS. 7A-7D are used to illustrate a connection between a gate of transistor MP1 and a drain of transistor MP3 by conductive line LGD_P1_P3 shown in FIG. 3.

FIG. 7B is a cross-section diagram 700B at line L710 of FIG. 7A, in accordance with some embodiments. As illustratively shown in FIG. 7B, conductive line LGD_P1_P3 is connected with vias VIA1-30 and VIA1-40. Further, via VIA1-30 is coupled with line LGG_P1_N1, via VIA0-30, and poly structure PO_P1 that forms the gate of transistor MP1.

FIG. 7C is a cross-section diagram 700C at line L740 in FIG. 7A, in accordance with some embodiments. In FIG. 7C, conductive line LGD_P1_P3 is coupled with via VIA1-40, metal piece M1_71, via VIA0_71, metal piece M0_71, and region D_P3 that forms the drain of transistor P3. Effectively, conductive line LGD_P1_P3 connects the gate of transistor MP1 and the drain of transistor MP3.

FIG. 7D is a cross-section diagram 700D at line L720 in FIG. 7A, in accordance with some embodiments.

In FIG. 7D, poly structure PO_P1 is coupled with via VIA0-30, line LGG_P1_N1, via VIA0-40, and poly structure PO_N1. Because poly structure PO_P1 forms the gate of transistor MP1 and poly structure PO_N1 forms the gate of transistor MN1, effectively, the gate of transistor MP1 is coupled with the gate of transistor MN1. A connection between the drain of transistor MP3 and the drain of transistor MN3 is similar to the connection between the drain of transistor MP1 and the drain of transistor MN1 as illustratively shown in FIG. 5. Effectively, conductive line LGD_P1_P3 connects the gates of transistors MP1, MN1 and the drains of transistors MP3, MN3.

In some embodiments, conductive line LGD_P1_P3 is considered long based on various factors as described with reference to conductive line LDD_P1_N1. As a result, in some embodiments, conductive line LGD_P1_P3 is formed by mask M20.

Similar Circuits

Various embodiments of the present disclosure include similar circuits. For example, in some embodiments regarding a symmetrical circuit having a first circuit similar to second circuit, conductive lines are configured such that performance of the first circuit is substantially the same as performance of the second circuit. For another example, in some embodiments, conductive lines in the first circuit and in the second circuit are configured to meet at least one of the following conditions: a resistivity of a conductive line in the first circuit is substantially the same as a resistivity of a corresponding conductive line in the second circuit, an RC constant of a conductive line in the first circuit is substantially the same as an RC constant of a corresponding conductive line in the second circuit, and/or a first current in the first circuit is substantially the same as a second current in the corresponding second circuit. A current mirror that has a current in a first branch substantially the same as a current in a second branch is an exemplary circuit that can benefit from various embodiments of the present disclosure. Various pairs of similar circuits and/or symmetrical circuits are within the contemplated scope of the present disclosure.

Figure 8:
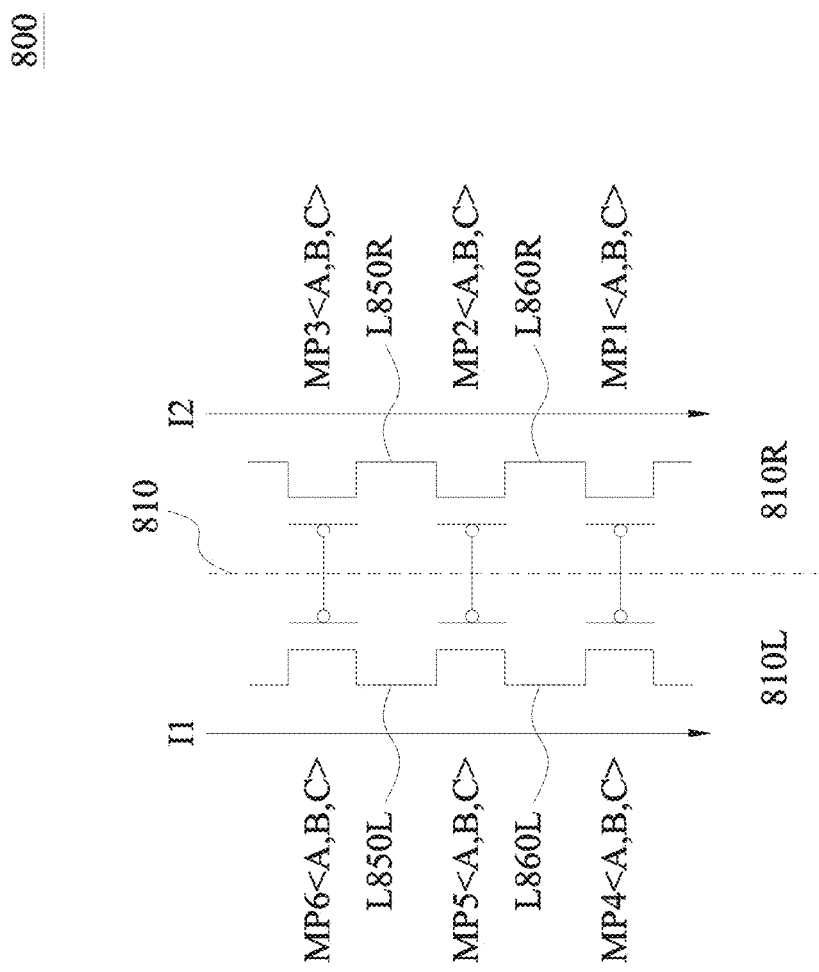
FIG. 8 is a circuit diagram of an exemplary symmetrical circuit, in accordance with some embodiments.

FIG. 8 is a diagram of an exemplary symmetrical circuit 800, in accordance with some embodiments. Circuit 800 includes a circuit 810L symmetrical with a circuit 810R with reference to a line 810. As illustratively shown, circuit 810L includes nine PMOS transistors MP6<A,B,C>, MP5<A,B,C>, and MP4<A,B,C> corresponding to nine PMOS transistors MP3<A,B,C>, MP2<A,B,C>, and MP1<A,B,C>, respectively, in circuit 810R.

In various embodiments, conductive lines to connect various terminals of transistors MP1<A,B,C> to MP6<A,B, C> in circuits 810L and 810R are configured such that a current I1 in circuit 810L is substantially the same as a current I2 in circuit 810R. Current I1 flows from sources of transistors MP6<A,B,C> through transistors MP6<A,B,C>, MP5<A,B,C>, and MP4<A,B,C> to drains of transistors MP4<A,B,C>. Current I2 flows from sources of transistors MP3<A,B,C> through transistors MP3<A,B,C>, MP2<A,B,C>, and MP1<A,B,C> to drains of transistors MP1<A,B,C>.

In various embodiments, when a conductive line in circuit 810L is formed by a mask, such as mask M10 in FIG. 13F, for example, a corresponding conductive line in circuit 810R is formed by the same mask M10. Similarly, when a conductive line in circuit 810L is formed by another mask, such as mask M20 in FIG. 13F, a corresponding conductive line in circuit 810R is formed by the same mask M20. As illustratively shown in FIG. 8, conductive line L850L connects the drains of transistors MP6<A,B,C> and the sources of transistor MP5<A,B,C>, and corresponds to conductive line L850R that connects the drains of transistors MP3<A,B,C> and the sources of transistor MP2<A,B,C>. Similarly, conductive line L860L connects the drains of transistors MP5<A,B,C> and the sources of transistor MP4<A,B,C> and corresponds to conductive line L860R that connects the drains of transistors MP2<A,B,C> and the sources of transistor MP1<A,B,C>. Other conductive lines in circuit 810L corresponding to conductive lines in circuit 810R are within the contemplated scope of the present disclosure.

Figure 9:
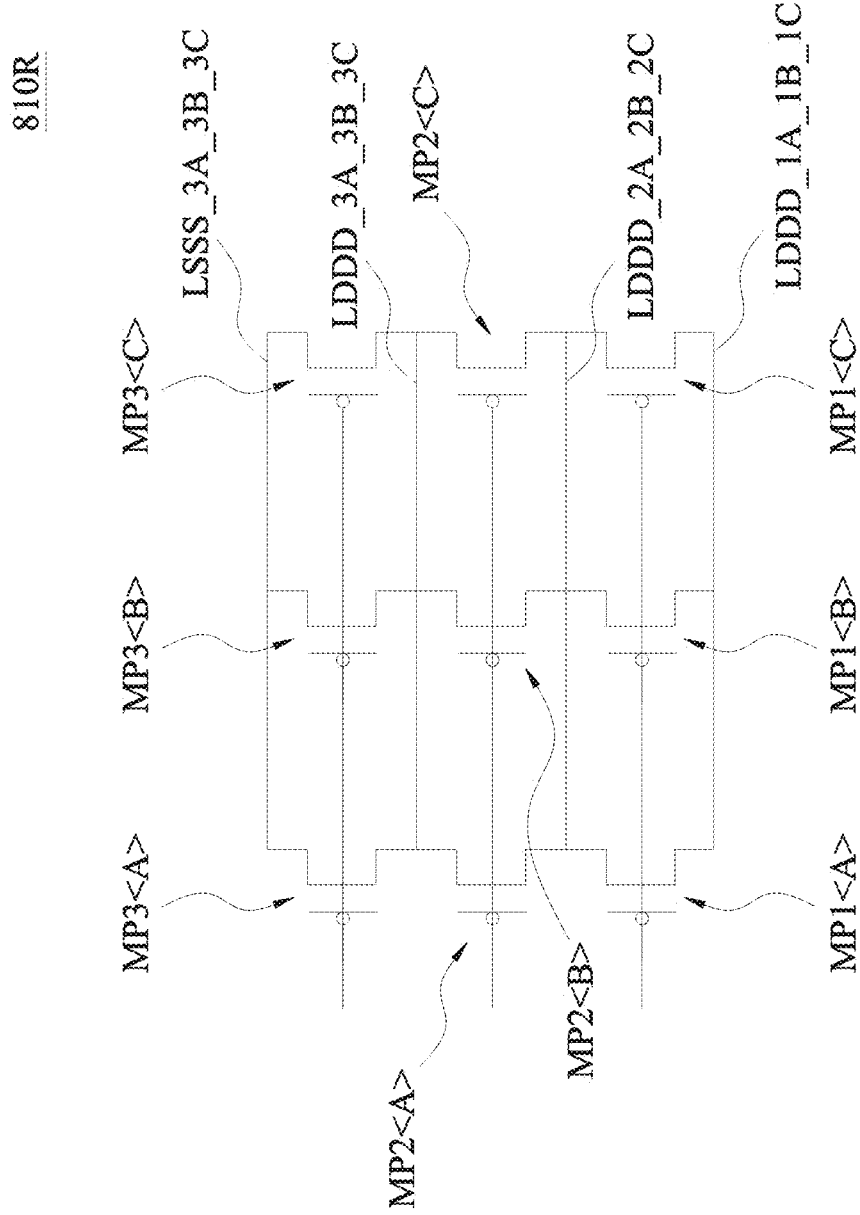
FIG. 9 is a circuit diagram of a portion of the circuit in FIG. 8, in accordance with some embodiments.

FIG. 9 is a detailed circuit diagram of circuit 810R in FIG. 8, in accordance with some embodiments. As illustratively shown, gates of transistors MP3<A>, MP3<B>, MP3<C> are coupled together. Sources of transistors MP3<A>, MP3<B>, MP3<C> are coupled together by a conductive line LSSS_3A_3B_3C. Drains of transistors MP3<A>, MP3<B>, MP3<C> are coupled together by a conductive line LDDD_3A_3B_3C, and are also coupled with sources of transistors MP2<A>, MP2<B>, MP2<C>.

Gates of transistors MP2<A>, MP2<B>, MP2<C> are coupled together. Drains of transistors MP2<A>, MP2<B>, MP2<C> are coupled together by a conductive line LDD_2A_2B_2C, and are also coupled with sources of transistors MP1<A>, MP1<B>, MP1<C>.

Gates of transistors MP1<A>, MP1<B>, MP1<C> are coupled together. Drains of transistors MP1<A>, MP1<B>, MP1<C> are coupled by a conductive line LDDD_1A_1B_1C.

In some embodiments, conductive lines LSSS_3A_3B_3C, LDDD_3A_3B_3C, LDDD_2A_2B2C, and LDDD_1A_1B_1C are each considered long based on various factors as described with reference to conductive line LDD_P1_N1, and are formed by mask M20 in FIG. 13F. Additionally, conductive lines in circuit 810L corresponding to conductive lines LSSS_3A_3B_3C, LDDD_3A_3B_3C, LDDD_2A_2B_2C, and LDDD_1A_1B_1C are also considered long and are formed by mask M20.

In some embodiments, the drain of transistor MP3<A> and the source of transistor MP2<A> are formed by the same OD region. Effectively, the drain of transistor MP3<A> is coupled with the source of transistor MP2<A>. Similarly, the drain of transistor MP2<A> and the source of transistor MP1<A> are formed by the same OD region. Effectively, the drain of transistor MP2<A> is coupled with the source of transistor MP1<A>. A connection between a drain of transistor MP3<B> and a source of transistor MP2<B> and a connection between a drain of transistor MP3<C> and a source of transistor MP2<C> are each similar to the connection between the drain of transistor MP3<A> and the source of transistor MP2<A>. Similarly, a connection between a drain of transistor MP2<B> and a source of transistor MP1<B> and a connection between a drain of transistor MP2<C> and a source of transistor MP1<C> is similar to a connection between the drain of transistor MP2<A> and the source of transistor MP1<A>.

Figure 10:
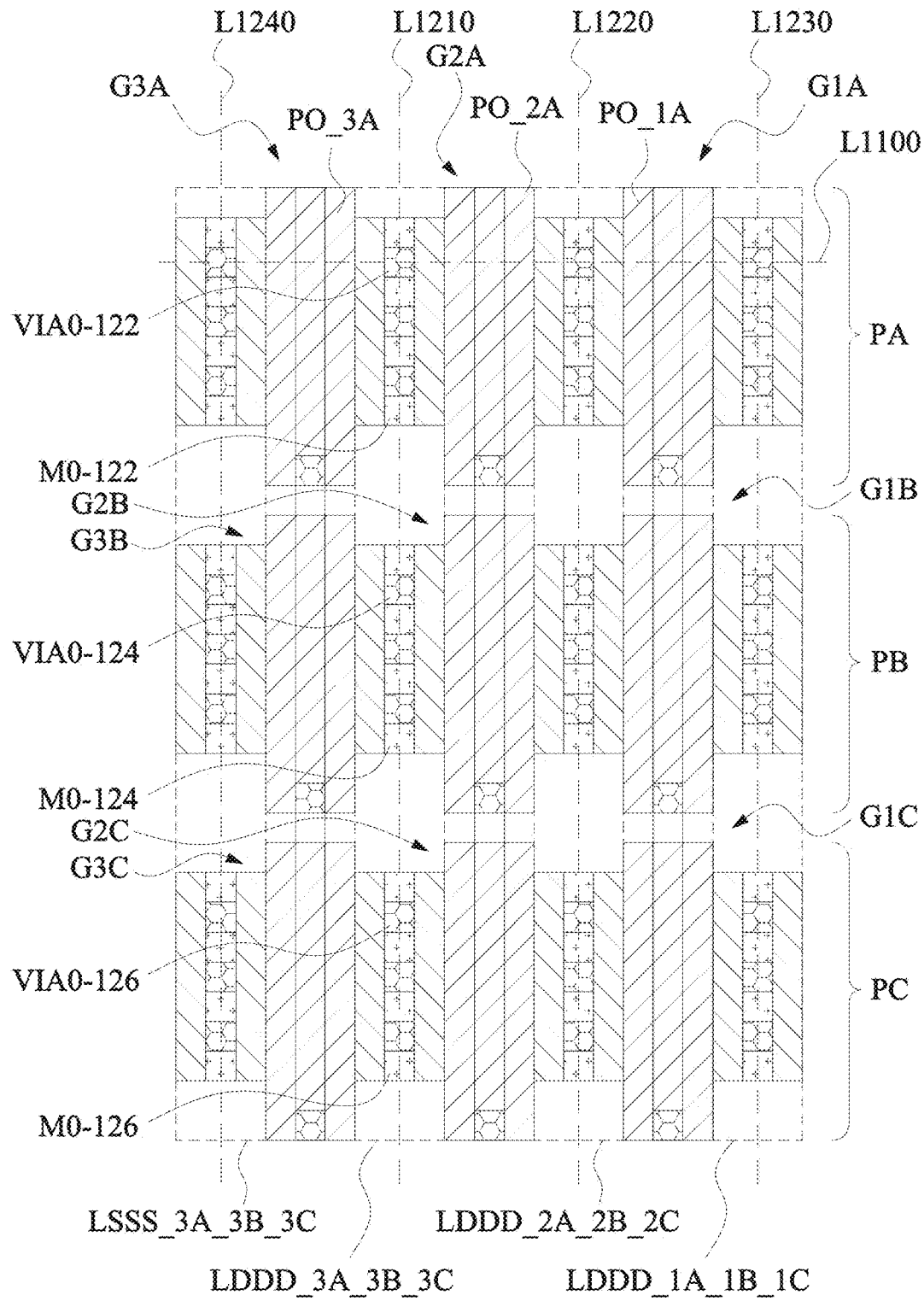
FIG. 10 is a layout diagram of a semiconductor structure used to form the circuit in FIG. 9, in accordance with some embodiments.

FIG. 10 is a layout diagram of a semiconductor structure 1000, in accordance with some embodiments. Semiconductor structure 1000 is used to form circuit 810R in FIG. 9. Circuit 810L in FIG. 8 is formed by a semiconductor structure similar to semiconductor structure 1000. Structure 1000 includes a first sub-structure PA, a second sub-structure PB, and a third sub-structure PC. Sub-structure PA is used to form transistors MP3<A>, MP2<A>, MP1<A>. Sub-structure PB is used to form transistors MP3<B>, MP2<B>, MP1<B>, and substructure PC is used to form transistors MP3<C>, MP2<C>, MP1<C>. For simplicity, various elements associated with sub-structure PB and sub-structure PC are not labeled, but are similar to those associated with sub-structure PA. Sub-structures PA, PB, and PC each have various structure elements similar to those of structure 100 in FIG. 1, including, for example, poly structures PO, substrate SB, vias VIA0, etc.

Figure 12:
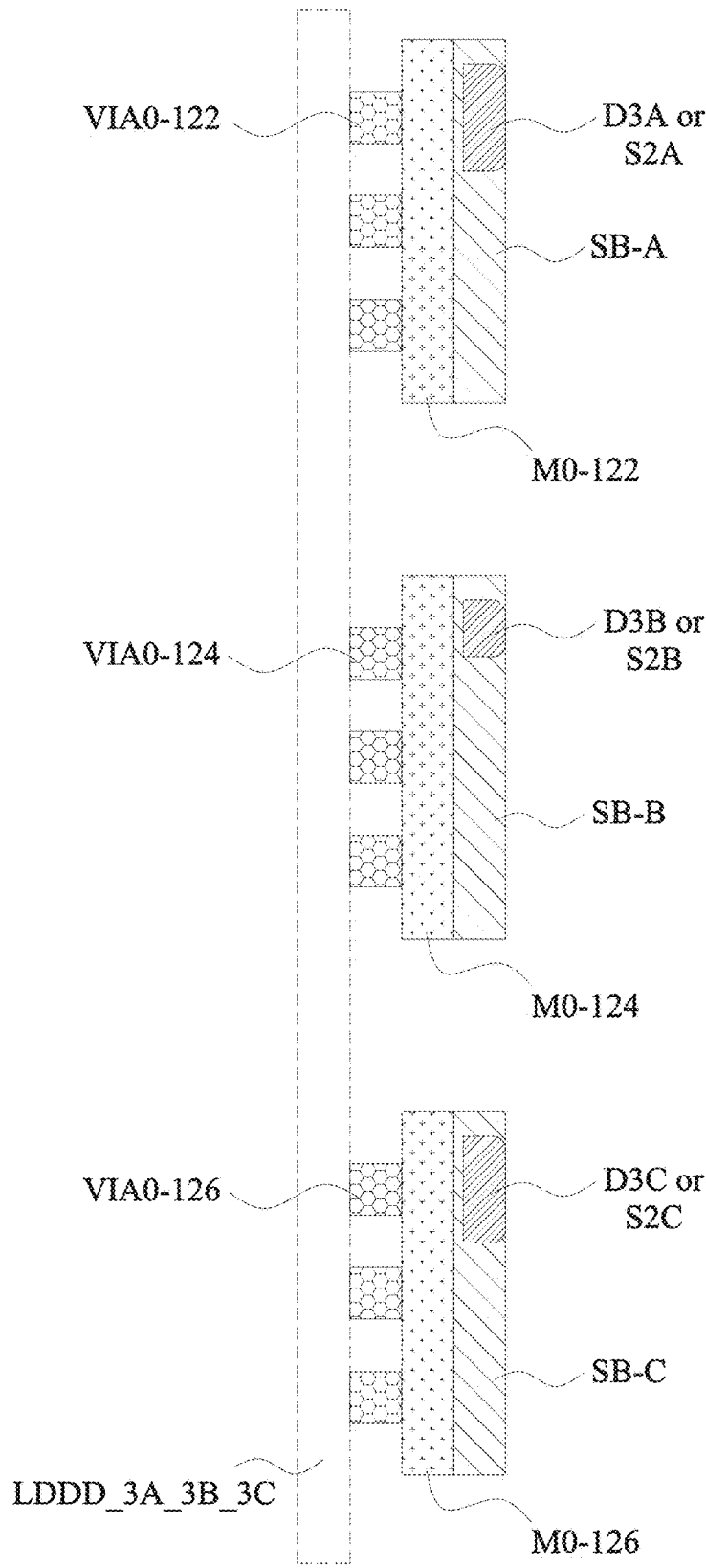
FIG. 12 is a cross-section diagram at another line of the layout diagram in FIG. 10, in accordance with some embodiments.

For illustration, sub-structures PA, PB, and PC include corresponding substrates SB-A, SB-B, and SB-C shown in FIG. 12.

Poly structures PO_3A, PO_2A, PO_1A are used to form the gates of transistors MP3<A>, MP2<A>, MP1<A>, respectively.

Lines L1100, L1210, L1220, and L1230 are lines for cross-section diagrams explained with reference to FIGS. 11 and 12 respectively.

Figure 11:
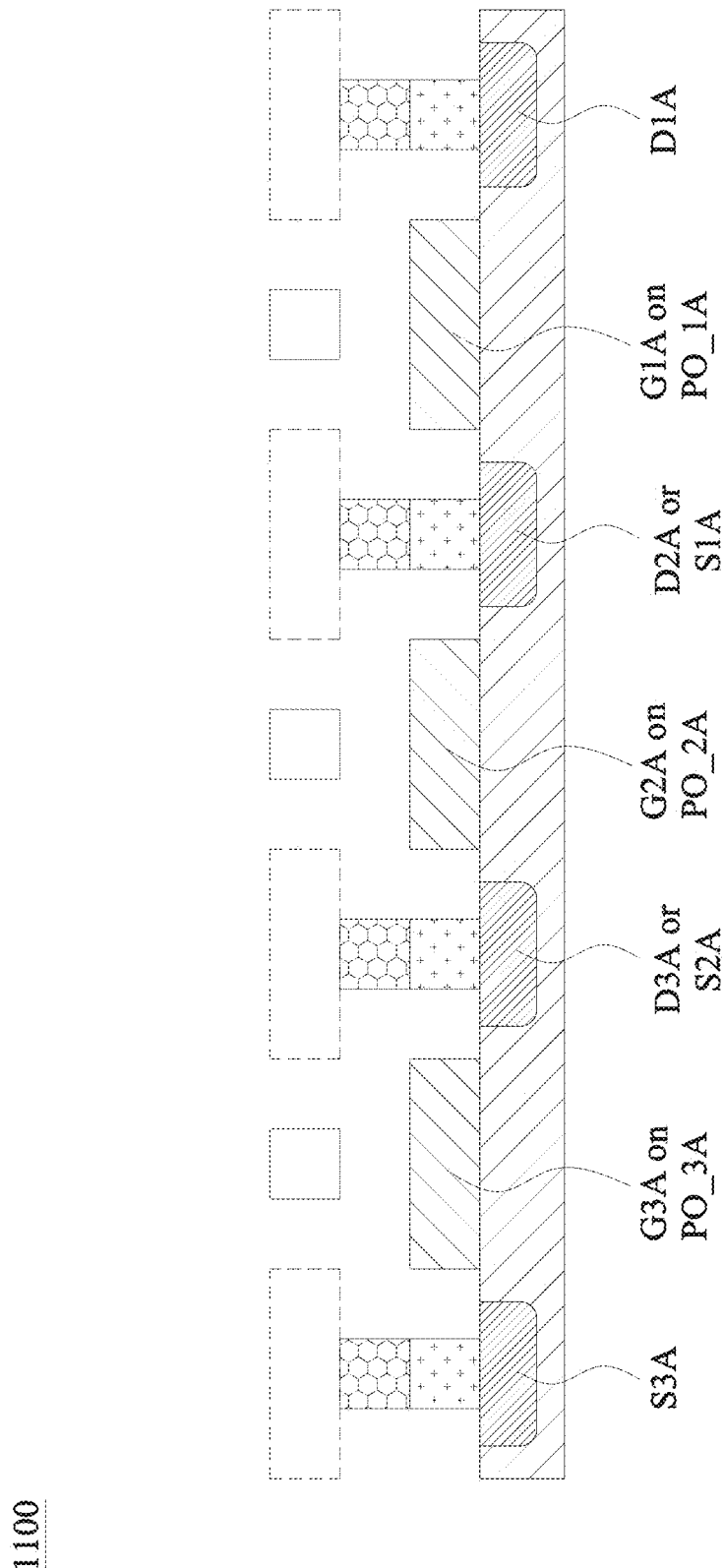
FIG. 11 is a cross-section diagram at a line of the layout diagram in FIG. 10, in accordance with some embodiments.

FIG. 11 is a cross section diagram 1100 at line L1100 in FIG. 10, in accordance with some embodiments. Diagram 1100 is used to illustrate a connection between a drain of transistor MP3<A> and a source of transistor MP2<A>, and between a drain of transistor MP2<A> and a source of transistor MP1<A>. In some embodiments, as illustratively shown in FIG. 11, the drain of transistor MP3<A> is formed by OD region D3A, which is also used to form the source of transistor MP2<A>. For illustration, OD region D3A is also called OD region S2A. Similarly, the drain of transistor MP2<A> is formed by OD region D2A, which is also used to form the source of transistor MP1<A>, and is also called OD region S1A.

A connection between a drain of transistor MP3<B> and a source of transistor MP2<B>, and between a drain of transistor MP2<B> and a source of transistor MP1<B> is similar to the connection between a drain of transistor MP3<A> and a source of transistor MP2<A>, and between a drain of transistor MP2<A> and a source of transistor MP1<A>, respectively. Further, a connection between a drain of transistor MP3<C> and a source of transistor MP2<C>, and between a drain of transistor MP2<C> and a source of transistor MP1<C> is similar to the connection between a drain of transistor MP3<A> and a source of transistor MP2<A>, and between a drain of transistor MP2<A> and a source of transistor MP1<A>, respectively.

FIG. 12 is a cross section diagram 1200 at line L1210 in FIG. 10, in accordance with some embodiments. Diagram 1200 is used to illustrate a connection between drains of transistors MP3<A>, MP3<B>, and MP3<C>. In FIG. 12, the drains of transistors MP3<A>, MP3<B>, MP3<C> are formed by OD regions D3A, D3B, and D3C, respectively. As illustratively shown in FIG. 12, OD regions D3A, D3B, D3C are coupled with metal pieces M0-122, M0-124, M0-126, respectively, and with vias VIA0-122, VIA0-124, VIA0-126, respectively. Further, conductive line LDDD_3A_3B_3C is coupled with vias VIA0-122, VIA0-124, and VIA0-126. Effectively, conductive line LDDD_3A_3B_3C couples the drains of transistors MP3<A>, MP3<B>, MP3<C> together.

In a same manner as conductive line LDDD_3A_3B_3C connects the drains of transistors MP3<A>, MP3<B>, MP3<C>, conductive line LDDD_2A_2B_2C connects the drains of transistors MP2<A>, MP2<B>, MP2<C>, conductive line LDDD_1A_1B_1C connects the drains of transistors MP1<A>, MP1<B>, MP1<C>, and conductive line LSSS_3A_3B_3C connects the sources of transistors MP3<A>, MP3<B>, MP3<C>. For example, a cross section diagram at each line L1220, L1230, and L1240 in FIG. 10 is similar to cross section diagram 1200 in FIG. 12.

In various embodiments, conductive lines LSSS_A_3B_3C LDDD_3A_3B_3C, LDDD_2A_2B_2C, LDDD_1A_1B_1C are each considered long based on various factors as described with reference to conductive line LDD_P1_N1, and are each formed by mask M20 in FIG. 13F.

Figure 12A:
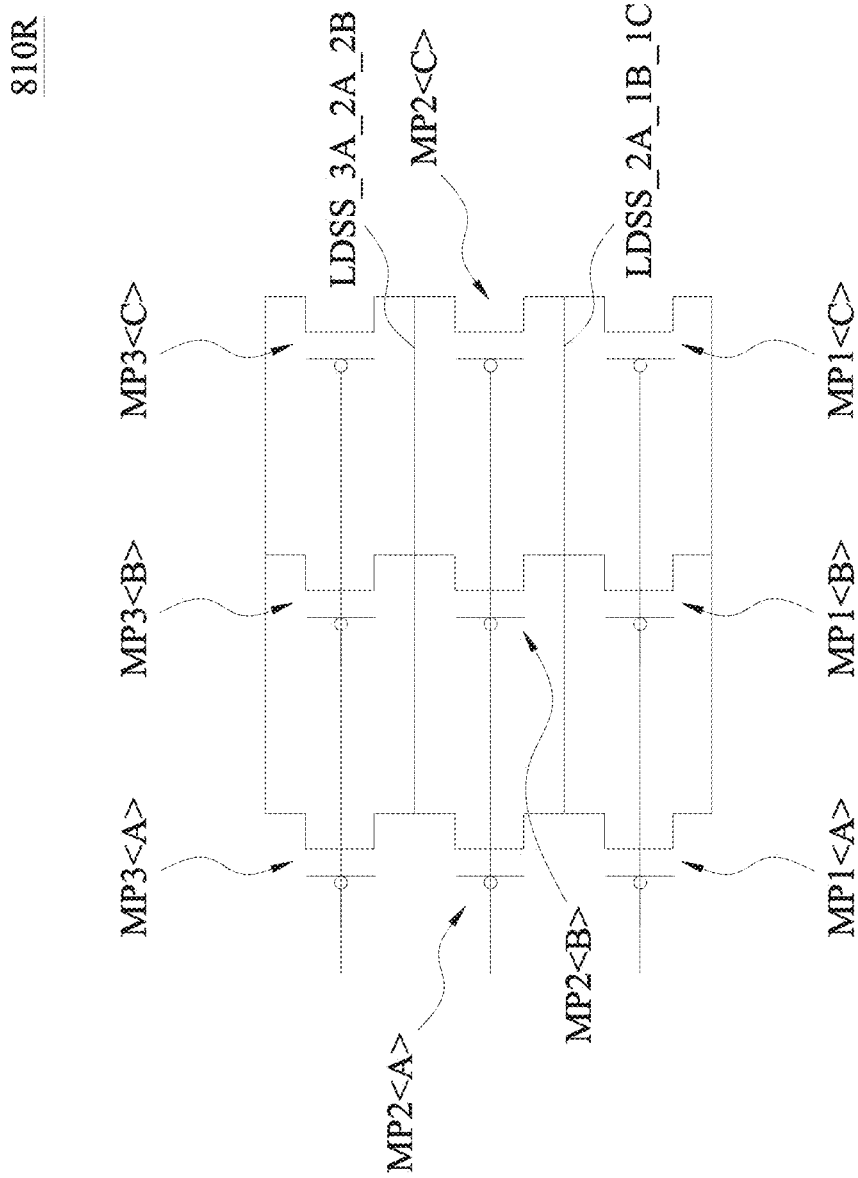
FIG. 12A is a diagram of the circuit in FIG. 9 reproduced having labels related to FIGS. 12B and 12C, in accordance with some embodiments.
Figure 12B:
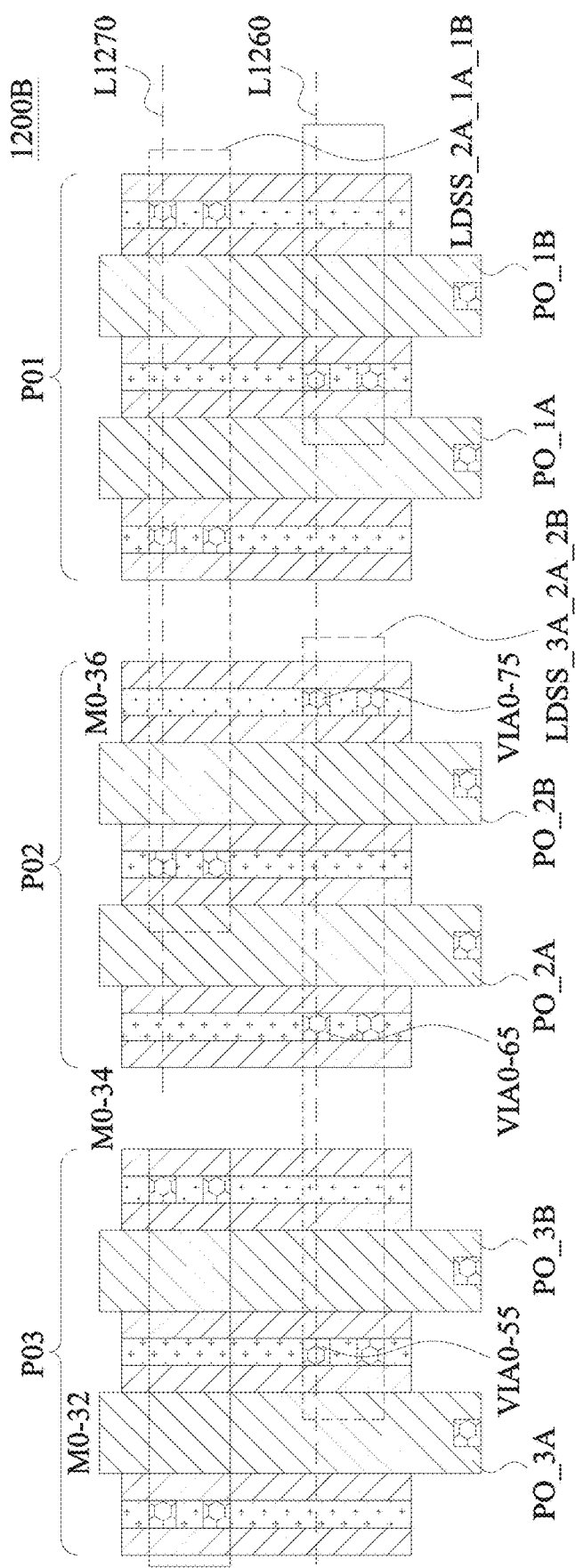
FIG. 12B is a diagram of a semiconductor structure used to form a portion of the circuit in FIG. 12A.
Figure 12C:
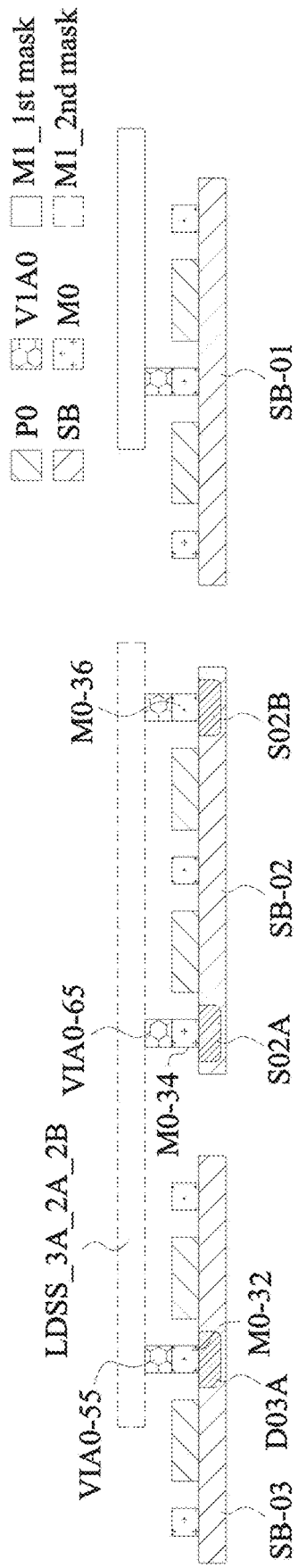
FIG. 12C is a cross-section diagram of the semiconductor structure in FIG. 12B, in accordance with some embodiments.

FIG. 12A is a diagram of circuit 810R in FIG. 9 reproduced with label related to FIGS. 12B and 12C. FIGS. 12A-C are used to illustrate another way to connect the drain of transistor MP3<A> to the source of transistor MP2<A> and the source of transistor MP2<B>, in accordance with some embodiments.

FIG. 12B is a layout diagram of a semiconductor structure 1200B, in accordance with some embodiments. Semiconductor structure 1200B is used to form a portion of circuit 810R in FIG. 12A. For example, structure 1200B is used to form transistors MP3<A,B>, MP2<A,B> and MP1<A,B>, and without transistors MP3<C>, MP2<C>, MP1<C> in FIG. 12A.

Structure 1200B includes a first sub-structure P01, a second sub-structure P02, and a third sub-structure P03. Sub-structure P01 is used to form transistors MP1<A>, MP1<B>. Sub-structure P02 is used to form transistors MP2<A>, MP2<B>, and substructure P03 is used to form transistors MP3<A>, MP3<B>. For simplicity, various elements associated with sub-structures P01, P02, P03 are not labeled. Sub-structures P01, P02, and P03 each have various structure elements similar to those of structure 100 in FIG. 1, including, for example, poly structures PO, substrate SB, vias VIA0, etc.

For illustration, sub-structures P01, P02, and P03 include substrates SB-01, SB-02, and SB-03, respectively, which are labeled in FIG. 12C. Sub-structure P01 includes poly structure PO_1A, PO_1B. Sub-structure P02 includes poly structure PO_2A, PO_2B, and sub-structure P03 includes poly structure PO_3A, PO_3B. Poly structures PO_3A, PO_2A, PO_1A are used to form the gates of transistors MP3<A>, MP2<A>, MP1<A>, respectively. Poly structures PO_3B, PO_2B, PO_1B are used to form the gates of transistors MP3<B>, MP2<B>, MP1<B>, respectively. Corresponding OD regions in sub-structures P01, P02, and P03 are used to form the drains and the sources of transistors MP1<A,B>, MP2<A,B>, and MP3<A,B> respectively.

Lines L1260 and L1270 are used for cross-section diagrams explained with reference to FIGS. 12C.

FIG. 12C is a cross section diagram 1200C at line L1260 in FIG. 12A, in accordance with some embodiments. Diagram 1200C is used to illustrate a connection between the drain of transistor MP3<A>, the source of transistor MP2<A>, and the source of transistor MP2<B> by conductive line LDSS_3A_2A_2B.

OD regions DO3A, SO2A, and SO2B form the drain, the source, and the source of transistors MP3<A>, MP2<A>, and MP2<B>, respectively.

In some embodiments, as illustratively shown in FIG. 12C, OD region DO3A is coupled with metal piece M0-32, via VIA0-55, and conductive line LDSS_3A_2A_2B. OD region SO2A is coupled with metal piece M0-34, via VIA0-65, and conductive line LDSS_3A_2A_2B. OD region SO2B is coupled with metal piece M0-36, via VIA0-75, and conductive line LDSS_3A_2A_2B. Effectively, conductive line LDSS_3A_2A_2B connects the drain, the source, and the source of corresponding transistors MP3<A>, MP2<A>, and MP2<B>.

Conductive line LDSS_2A_1A_1B connects the drain, the source, and the source of corresponding transistors MP2<A>, MP1<A>, and MP1<B> in a same manner as conductive line LDSS_3A_2A_2B connects the drain, the source, and the source of corresponding transistors MP3<A>, MP2<A>, and MP2<B>. For example, a cross section diagram at line L1270 is similar to cross section diagram 1200C in FIG. 12C, but, for simplicity, is not shown.

Sub-structure P01 forming two transistors MP1<A>, MP1<B> is for illustration. Sub-structure P01 forming additional transistors is within the contemplated scope of the present disclosure. For example, additional poly structures are added to form gates of the additional transistors. Corresponding OD regions in substrate SB-01 form sources and drains of the additional transistors. For another example, a poly structure PO_1C (not labeled) is added to sub-structure P01 to form the gate of transistor MP1<C>. Corresponding OD regions DO1C (not labeled) and SO1C (not labeled) in substrate SB-01 are used to form the drain and the source of transistor MP1<C>. Forming additional transistors in sub-structures P03 and P02 is done in a manner similar to forming additional transistors in substructure P01. When additional transistors are formed in corresponding sub-structures P01, P02, and P03, conductive lines LDSS_3A_2A_2B and LDSS_2A_1A_1B are extended to connect terminals of corresponding additional transistors. For example, when transistors MP3<C>, MP2<C>, and MP<1C> are added to corresponding sub-structures P03, P02, and P01, conductive line LDSS_3A_2A_2B is extended to connect the source of transistor MP2<C>. In such a situation, effectively, conductive line LDSS_3A_2A_2B connects the drain, the source, the source, and the source of corresponding transistors MP3<A>, MP2<A>, MP2<B>, and MP2<C>. Similarly, conductive line LDSS_2A_1A_1B is extended to connect the source of transistor MP1<C>. In such a situation, conductive line LDSS_2A_1A_1B connects the drain, the source, the source, and the source of corresponding transistors MP2<A>, MP1<A>, MP1<B>, MP1<C>, etc.

In various embodiments, conductive line LDSS_3A_2A_2B and conductive line LDSS_2A_1A_1B are each considered long based on various factors as discussed with reference to conductive line LDD_P1_N1, and are each formed by mask 20M in FIG. 13F.

As illustrated in FIGS. 9-12 and FIGS. 12A-12C, different semiconductor structures are used to form the same circuit 810R, resulting in different conductive lines connecting the same terminals of various transistors. For example, conductive line LDD_3A_3B_3C in FIG. 9 connects the drains of transistors MP3<A,B,C>. Conductive line LDSS_3A_2A_2B in FIG. 12A effectively connects the drains of the same transistors MP3<A,B,C>. In various embodiments of the present disclosure, regardless of the semiconductor structures being used to form transistors and/or other devices, when a conductive line is considered long, a current, a resistivity and/or a RC constant of a conductive line is decided to be reduced, the conductive line is formed to have a wider width by using second mask M20, for example.

Forming Conductive Lines

Figure 13G:
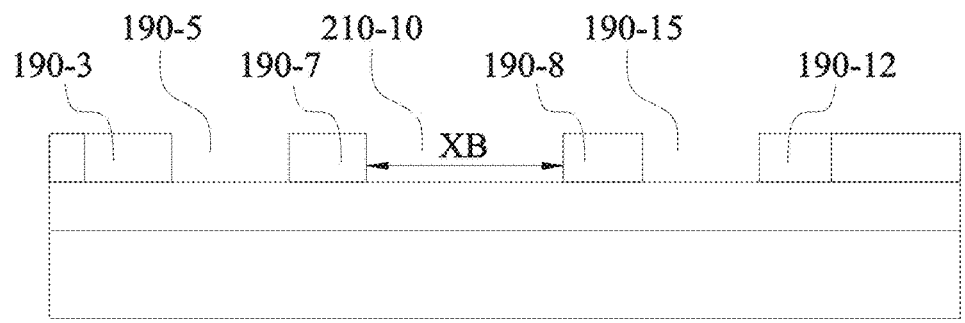
Figure 13H:
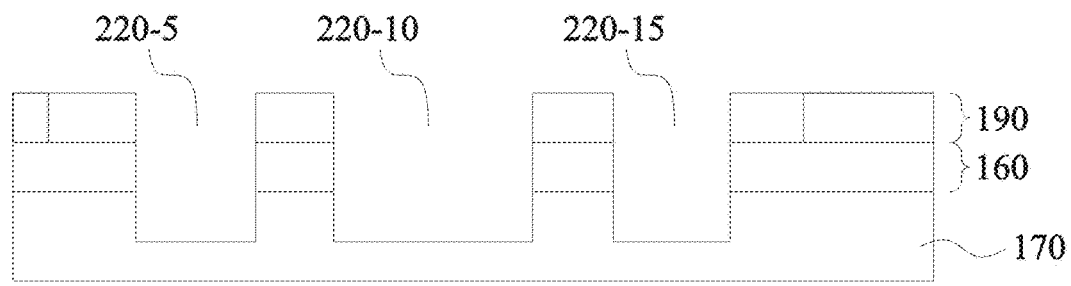
Figure 13I:
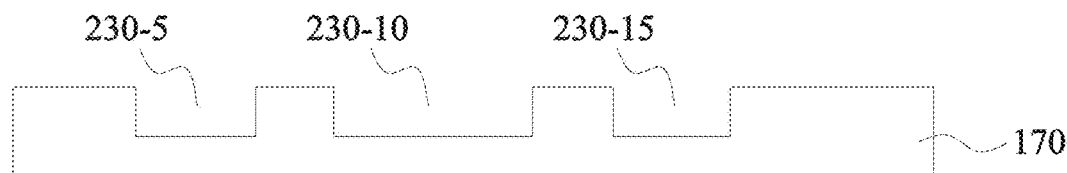
Figure 13J:
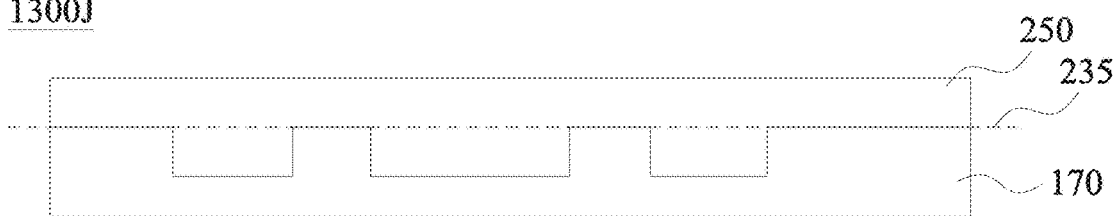
Figure 13K:
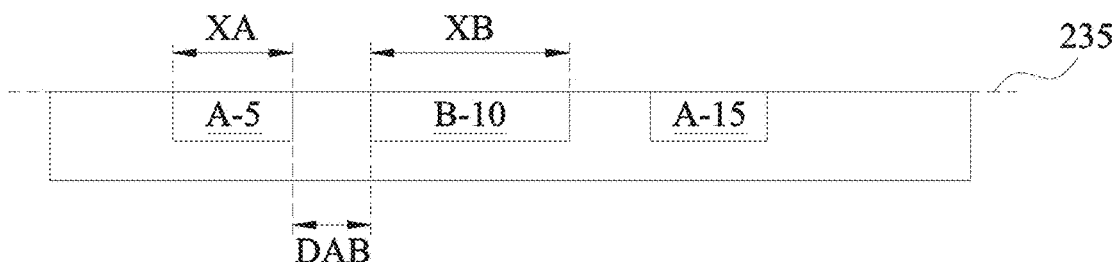

FIGS. 13A-13K are diagrams used to illustrate how conductive lines are formed by a first mask or a second mask, in accordance with some embodiments. For illustration, the first mask is called mask M10, and is shown in FIG. 13B. The second mask is called mask M20, and is shown in FIG. 13F. Further, long conductive lines are formed by mask M20, and other conductive lines are formed by mask M10. Additionally, conductive lines A-5 and A-15 in FIG. 13K are formed by first mask M10 and have a width smaller than that of conductive line B-10 formed by second mask M20. Conductive line A-5 thus corresponds to conductive line LGG_P1_N1 in FIG. 7C while conductive line B-10 corresponds to long conductive lines LDD_P1_N1, LDD_P2_N2, LDD_P3_N3, etc.

With reference to FIG. 13A, a pattern 130-5 represents conductive line A-5 in FIG. 13K, and a pattern 130-15 represents conductive line A-15. Expressed in another way, pattern 130-5 is used to form conductive line A-5, and pattern 130-15 is used to form conductive line A-15. Similarly, pattern 130-10 is used to form conductive line B-10. In some embodiments, patterns 130-5, 130-10, and 130-15 are included in a graphic database system (GDS) file. In some embodiments, conductive lines A-5 and A-15 have a same width XA. For simplicity, forming conductive line A-5 is described, but the same procedure to form conductive line A-5 is also applicable to form conductive line A-15. Conductive line B-10 has a width XB. Because patterns 130-5 and 130-15 are used to form conductive lines A-5 and A-15, in some embodiments, patterns 130-5 and 130-15 are each associated with width XA stored in a data file, for example. Similarly, pattern 130-10 is associated with width XB. In some embodiments, widths XA and XB are provided in the data file when a layout for circuits that use conductive lines A-5 and B-5 are designed, such as, when the layout is drawn in a computer. As a result, a size of width XA and/or XB may be adjusted during the layout design stage. In some embodiments, patterns 130-5 and 130-15 are associated with a color of mask M10 and pattern 130-10 is associated with a color of mask M20. Alternatively expressed, forming conductive lines A-5 and B-10 is based on corresponding colors of patterns 130-5 and 130-10.

FIG. 13B is a diagram of mask M10, in accordance with some embodiments. Mask M10 has patterns 140-5, 140-10, and 140-115 corresponding to patterns 130-5, 130-10, and 130-15 in FIG. 13A, respectively.

In some embodiments, pattern 140-5 has a width XA2S, which is the total of width XA plus two widths XS of spacers 190-3 and 190-7 in FIG. 13E. Alternatively expressed, width XA2S is designed to accommodate spacers 190-3 and 190-7. In some embodiments, a size of each of spacers 190-3 and 190-7 is used to determine a size of opening 150-5 in FIG. 13C. Width XA2S is therefore determined accordingly. In some embodiments, width XS is the same for various spacers associated with mask M10, including, for example, spacers 190-8, 190-12, etc., in FIG. 13E. In some embodiments, width WS of spacers 190-3, 190-5, 190-7, 190-8, 190-12 is designed such that a distance DAB between conductive line A-5 and conductive line B-10 in FIG. 13K is equal to or greater than a predetermined value, which is called a minimum space value between conductive line A-15 and conductive line B-10.

Pattern 140-10 has width XB of conductive line B-10, which is the same as a width of pattern 150-10 in FIG. 13C.

FIG. 13C is a cross section diagram of a structure 1300C, in accordance with some embodiments. In FIG. 13C, a hard mask layer 150 is above a buffer layer 160, which, in turn, is above a dielectric layer 170. Openings 150-5 and 150-15 of hard mask layer 150 are a result of an etch operation on layer 150 based on patterns 140-5 and 140-15 in FIG. 13B. Pattern 150-10 includes the hard mask material of hard mask layer 150 after forming openings 150-5 and 150-15.

In some embodiments, buffer layer 160 is added in between hard mask layer 150 and dielectric layer 170 to protect dielectric layer 170. For example, buffer layer 160 prevents potential damage to layer 170 due to the stress of layer 180 in FIG. 13D onto dielectric layer 170. In some embodiments, dielectric layer 170 surrounds metal strips in corresponding metal layers.

FIG. 13D is a cross-section diagram of a structure 1300D, in accordance with some embodiments. Structure 1300D is a result of structure 1300C being deposited with a layer 180 of spacer material. Layer 180 includes openings 180-5 and 180-15 corresponding to patterns 130-5 and 130-15 in FIG. 13A, respectively. Each of openings 180-5 and 180-15 has width XA corresponding to width XA of conductive lines A-5 and A-15 in FIG. 13K. A height Y180 of layer 180 is selected such that after an etch process to form structure 1300E in FIG. 13E, a thickness of layer 190 in FIG. 13E is substantially the same as a thickness of hard mask layer 150. Effectively, height Y180 is a function of a thickness of mask layer 150.

In some embodiments, the exposed surface of layer 180 including the bottom of opening 180-5 is etched at the same time. In some embodiments, etching includes bombarding ion to the surface of layer 180 and the bottom of opening 180-5. When the bottom of opening 180-5 reaches the surface of layer 160, the surface of layer 180 is leveled with the surface of pattern 150-10, the etch operation stops, resulting in structure 1300E in FIG. 13E. As illustratively shown in FIG. 13E, a portion of spacer material in layer 180 in structure 1300D has been removed to result in four spacers 190-3, 190-7, 190-8, and 190-12. Effectively, based on a thickness of hard mask layer 150, layer 190 is formed to have spacers 190-3, 190-7, 190-8, 190-12, pattern 150-10, and other hard mask material that, for simplicity, is not labeled.

Spacers 190-3 and 190-7 define opening 190-5. Spacers 190-7 and 190-8 are adjacent to hard mask pattern 150-10. In some embodiments, a surface of layer 190 is substantially flat. For example, the surface of pattern 150-10 and of spacers 190-3, 190-7, 190-8, and 190-12 are of about a same level. Openings 180-5 and 180-15 in FIG. 13D result in corresponding openings 190-5 and 190-15 having bottoms at a surface of layer 160.

FIG. 13F is used to illustrate second mask M20 is used to etch structure 1300E to result in structure 1300G in FIG. 13G. For simplicity, elements of structures 1300E are not labeled in FIG. 13F. In FIG. 13F, mask M20 has pattern 220-10 corresponding to pattern 150-10, and patterns 200-5, 200-15 corresponding to openings 190-5, 190-15, respectively. Patterns 200-5 and 200-15 are to prevent opening 190-5 and 190-15 from being etched.

Pattern 200-10 is to etch and thus remove hard mask pattern 150-10. In some embodiments, a width of pattern 200-10 is equal to or greater than a width of hard mask pattern 150-10, which, in some embodiments, is XB. In case the width of mask pattern 200-10 is greater than the width of hard mask pattern 150-10, the etch operation does not etch through spacers 190-3, 190-7, 190-8, or 190-12, because, in some embodiments, spacer material in layer 180 that forms spacers 190-3, 190-7, 190-8, and 190-12 is selected to stand against etching operation. In other words, during etching away pattern 150-10, opening 210-10 in FIG. 13G is conformed to width XB of pattern 150-10 that is defined by spacers 190-7 and 190-8.

FIG. 13H is a cross-section diagram of a structure 1300H, in accordance with some embodiments. Structure 1300H is a result of structure 1300G being etched into dielectric layer 170 and resulting in openings 220-5, 220-10, 220-15. Effectively, based on openings 190-5, 210-10, and 190-15, an etch operation etches through buffer layer 160 into dielectric layer 170.

FIG. 13I is a diagram of a structure 1300I, in accordance with some embodiments. Structure 1300I is the result of structure 1300H having layers 190 and 160 removed. Structure 1300I has openings 230-5, 230-10, and 230-15, which are called trenches of dielectric layer 170.

FIG. 13J is a diagram of a structure 1300J, in accordance with some embodiments. Structure 1300J is the result of structure 1300I having been filled with a layer 250 of conductive material, which, in some embodiments, is metal. The conductive material fills over trenches 230-5, 230-10, 230-15 and surface 235 of dielectric layer 170.

FIG. 13K is a diagram of a structure 1300K, in accordance with some embodiments. Structure 1300K is the result of structure 1300J being processed with a chemical mechanical process (CMP) operation. In some embodiments, the CMP operation removes conductive material on top of surface 235 and leaves behind conductive material in trenches 230-5, 230-10, 230-15 to form conductive lines A-5, B-10, and A-15, respectively. Effectively, conductive lines A-5, B-10, and A-15 are surrounded by dielectric material of dielectric layer 170. A number of embodiments have been described. It will nevertheless be understood that various modifications may be made without departing from the spirit and scope of the disclosure. For example, in various embodiments, when signal traces draw a larger amount of currents, conductive lines with a wider width are formed for those signal traces. For another example, in some embodiments, a current flowing through a drain and/or a source is much higher than a current flowing through a gate of the same transistor. In those embodiments, conductive lines related to the drain and/or the source are formed having a wider width, by, for example, using second mask M20.

Figure 14:
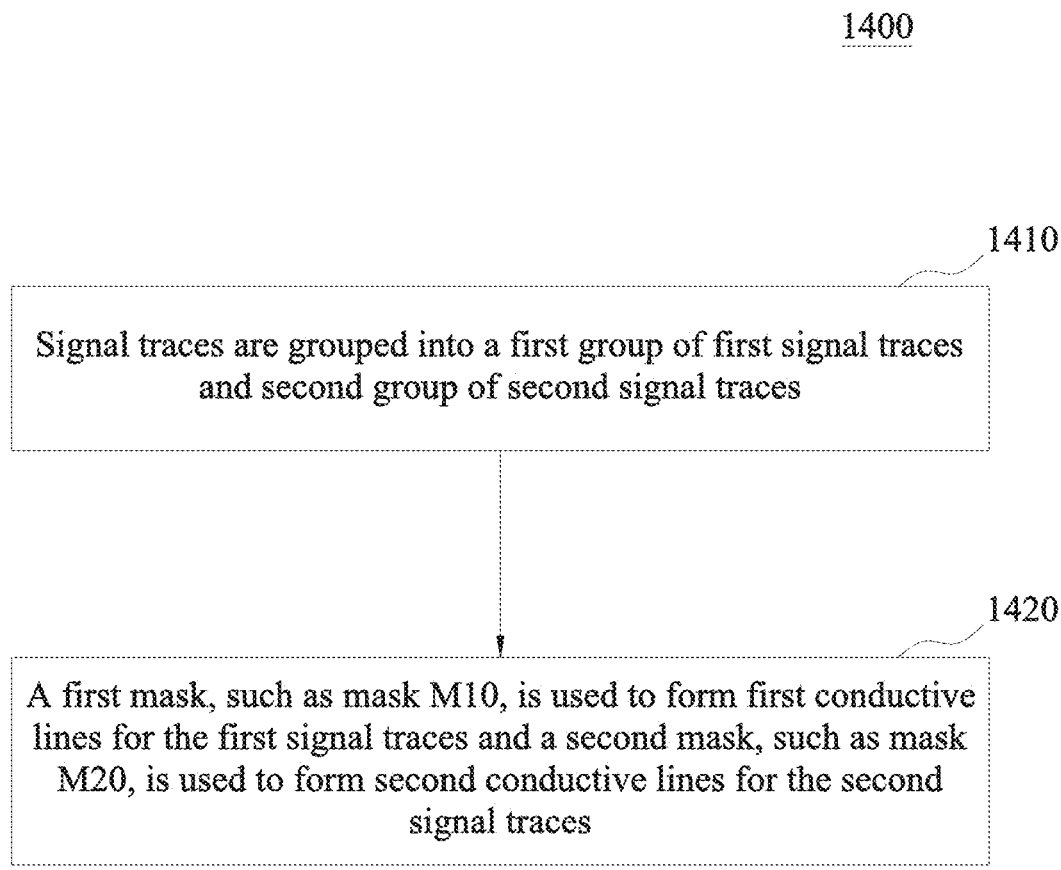
FIG. 14 is a flowchart illustrating a method of forming conductive lines in a circuit, in accordance with some embodiments.

FIG. 14 is a flowchart a method 1400 of forming conductive lines used in a circuit, in accordance with some embodiments.

In operation 1410, the signal traces are grouped into a first group of first signal traces and a second group of second signal traces. In some embodiments, the first signal traces have a first width, and the second signal traces have a second width different from the first width. Further, the grouping is based on at least one of the following conditions: a current flowing through a signal trace of the signal traces, a length of the signal trace, a resistivity of the signal trace, or a resistive-capacitive constant of the signal trace.

In operation 1420, a first mask, such as mask M10, is used to form first conductive lines for the first signal traces of the first group and a second mask, such as mask M20, is used to form second conductive lines for the second signal traces of the second group.

FIG. 15 is a flowchart 1500 illustrating a method of forming conductive lines, in accordance with some embodiments.

In some embodiments, operations of flowchart 1500 are based on a first mask used to form a first conductive line and a second mask used to form a second conductive line. In operation 1510, the first mask, such as mask M10, and a second mask, such as mask M20, are identified.

In operation 1520, the first mask is used to form a third conductive line if a width of the first conductive line is larger than a width of the second conductive line or the second mask is used to form the third conductive line if the width of the second conductive line is larger than the width of the first conductive line. In some embodiments, the third conductive line connects a first circuit element distant from a second circuit element by a predetermined value.

Figure 16:
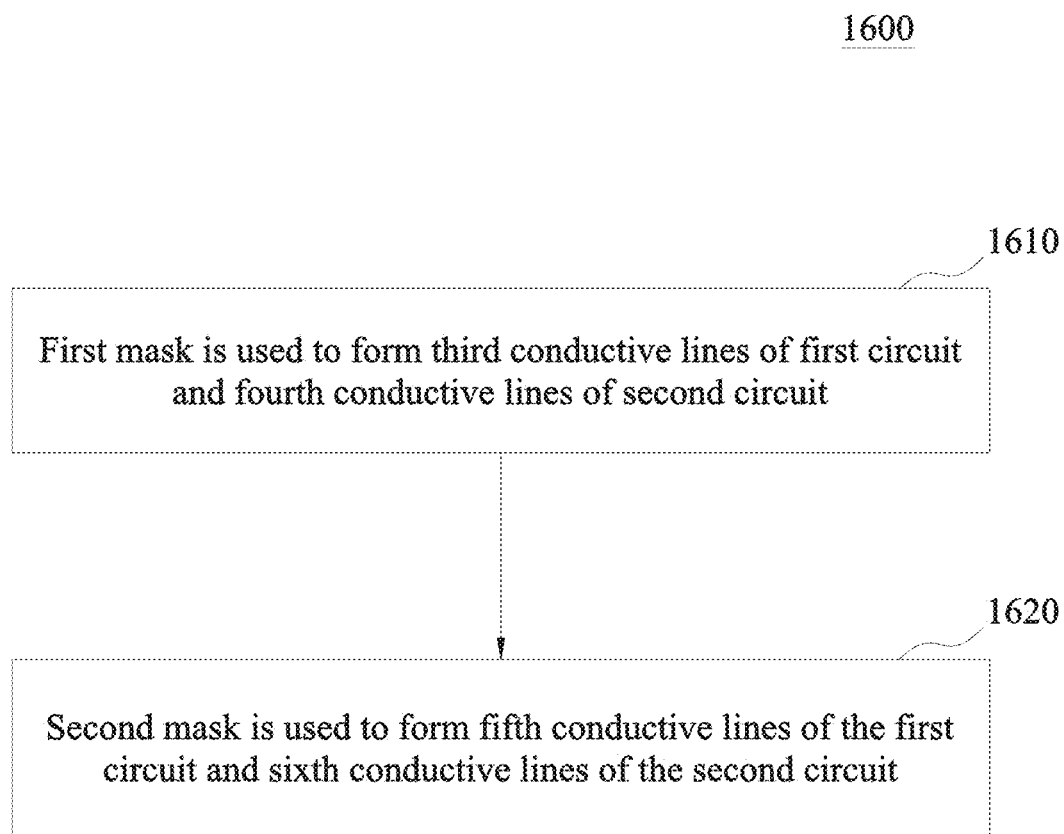
FIG. 16 is a flowchart illustrating another method of forming conductive lines, in accordance with some embodiments.

FIG. 16 is a flowchart 1600 illustrating another method of forming conductive lines, in accordance with some embodiments.

In some embodiments, the flowchart 1600 is based on a first circuit similar to a second circuit, a first mask used to form first conductive lines having a first width, a second mask used to form second conductive lines having a second width different from the first width. In some embodiments, the first mask is mask M10 and the second mask is mask M20.

In operation 1610, the first mask is used to form third conductive lines of the first circuit and fourth conductive lines of the second circuit. In some embodiments, each conductive line of the third conductive lines corresponds to each conductive line of the fourth conductive lines.

In operation 1620, the second mask is used to form fifth conductive lines of the first circuit and sixth conductive lines of the second circuit. In some embodiments, each conductive line of the fifth conductive lines corresponds to each conductive line of the sixth conductive lines. Further, the third conductive lines of the first circuit carry respective first currents and fifth conductive lines of the first circuit carry respective second currents, and a current value of the first currents is less than a current value of the second currents.

The above illustrations are based on two masks, masks M10 and M20. However, more than two masks may be used. For example, the inventive concepts disclosed herein are applicable in multi-patterning technology including self-aligned multi-patterning. Similarly to the two mask situations, each mask of the more than two mask situations is used to form a set of conductive lines. In various embodiments, a succeeding mask used to form a set of conductive lines having a width larger than a width of conductive lines formed by a preceding mask. For example, if three masks are used in the order of masks MA10, MA20, and MA30, conductive lines formed by second mask MA20 have a width larger than that of conductive lines formed by first mask MA10, and conductive lines formed by third mask MA30 have a width larger than that of conductive lines formed by second mask MA20.

However, other widths of conductive lines corresponding to other orders of masks being used to form the conductive lines are within the contemplated scope of the present disclosure. Explained in a different way, conductive lines having a larger width are formed regardless of the order of the masks being used to form the conductive lines. For example, mask MA10 may be used to form conductive lines having a width larger than one or both widths of conductive lines formed by mask MA20 or mask MA30. For another example, in the above illustrations, first mask M10 provides conductive line A-5 having a width smaller than a width of conductive line B-10 formed by second mask M20. In other embodiments, first mask M10 provides conductive lines having a width larger than a width of conductive lines formed by second mask M20. In such situations, conductive lines formed by first mask M10 are used for long signal trances.

Other ways to form different sets of conductive lines each set having a different width are within the contemplated scope of the present disclosure. Various circuits, including inverter ring 300, are used for illustration purposes. Other circuits are within the contemplated scope of the present disclosure.

In some embodiments, a method is disclosed. The method includes identifying at least a first mask or a second mask; fabricating, by the first mask, a first conductive line, fabricating, by the second mask, a second conductive line; and fabricating, by the first mask, a third conductive line if a dimension of the first conductive line is larger than a corresponding dimension of the second conductive line; or fabricating, by the second mask, the third conductive line if the dimension of the first conductive line is less than the corresponding dimension of the second conductive line. In some embodiments, a first circuit element is coupled to a second circuit element by at least the third conductive line, and the first circuit element is separated from the second circuit element by a predetermined distance.

In some embodiments, a method is disclosed. The method includes identifying at least a first mask or a second mask; fabricating, by a first mask, a first conductive line having a first width; fabricating, by a second mask, a second conductive line having a second width less than the first width; and fabricating, by the first mask, a third conductive line having the first width. In some embodiments, the third conductive line couples a first circuit element to a second circuit element, and the first circuit element is separated from the second circuit element by a predetermined distance.

In some embodiments, a method is disclosed. The method includes fabricating, by a first mask, a first set of conductive lines having a first dimension; fabricating, by a second mask, a second set of conductive lines having a second dimension, the first dimension being different from the second dimension; and fabricating, by the first mask, a third set of conductive lines of a first circuit and a fourth set of conductive lines of a second circuit. In some embodiments, the first circuit is similar to the second circuit, each conductive line of the third set of conductive lines corresponds to each conductive line of the fourth set of conductive lines, and each conductive line of the third set of conductive lines is configured to carry a corresponding first current.

Various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. In various embodiments, a source of a transistor can be configured as a drain, and a drain can be configured as a source. In some embodiments, a first value is substantially the same as a second value when a ratio between the first value over the second value is greater than about 90%. Other ratio values and/or different ways to determine whether the first value is substantially the same as the second value are within the contemplated scope of the present disclosure. Exemplary ratio values include 87%, 85%, 80%, etc.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A method, comprising:
   identifying at least a first mask or a second mask;
   fabricating, by the first mask, a first conductive line;
   fabricating, by the second mask, a second conductive line; and
   fabricating, by the first mask, a third conductive line if a dimension of the first conductive line is larger than a corresponding dimension of the second conductive line; or
   fabricating, by the second mask, the third conductive line if the dimension of the first conductive line is less than the corresponding dimension of the second conductive line,
   wherein a first circuit element is coupled to a second circuit element by at least the third conductive line, and the first circuit element is separated from the second circuit element by a predetermined distance.

2. The method of claim 1, wherein the predetermined distance includes at least one of:
   a predetermined width of a metal structure in a semiconductor structure;
   a predetermined width of a gate structure in the semiconductor structure; or
   a predetermined width between the metal structure and the gate structure.

3. The method of claim 1, wherein
   the first circuit element includes an input of a first inverter; and
   the second circuit element includes an output of a second inverter.

4. The method of claim 3, wherein
   the first inverter and the second inverter are part of an inverter ring.

5. The method of claim 1, wherein
   the third conductive line further couples the first circuit element and the second circuit element to a third circuit element and a fourth circuit element, and the first circuit element and the second circuit element are separated from the third circuit element and the fourth circuit element by another predetermined distance.

6. The method of claim 5, wherein
   the first circuit element includes a drain of a first P-type transistor;
   the second circuit element includes a drain of a first N-type transistor;
   the third circuit element includes a gate of a second P-type transistor;
   the fourth circuit element includes a gate of a second N-type transistor;
   the first P-type transistor and the first N-type transistor are part of a first inverter; and
   the second P-type transistor and the second N-type transistor are part of a second inverter.

7. The method of claim 1, wherein the predetermined distance includes a predetermined minimum width between two metal structures.

8. The method of claim 1, wherein the predetermined distance includes a predetermined width between two metal structures.

9. A method, comprising:
identifying at least a first mask or a second mask;
fabricating, by the first mask, a first conductive line having a first width;
fabricating, by the second mask, a second conductive line having a second width less than the first width; and
fabricating, by the first mask, a third conductive line having the first width,
wherein the third conductive line couples a first circuit element to a second circuit element, and the first circuit element is separated from the second circuit element by a predetermined distance.

10. The method of claim 9, wherein
the first circuit element includes a drain of a first P-type transistor;
the second circuit element includes a drain of a first N-type transistor; and
the third conductive line couples the drain of the first P-type transistor and the drain of the first N-type transistor together.

11. The method of claim 10, wherein the first P-type transistor and the first N-type transistor are part of an inverter.

12. The method of claim 9, wherein
the first circuit element includes an input of a first inverter; and
the second circuit element includes an output of a second inverter.

13. The method of claim 12, wherein
the first inverter and the second inverter are part of an inverter ring.

14. The method of claim 9, wherein
the third conductive line further couples the first circuit element and the second circuit element to a third circuit element and a fourth circuit element, and the first circuit element and the second circuit element are separated from the third circuit element and the fourth circuit element by another predetermined distance.

15. The method of claim 14, wherein
the first circuit element includes a drain of a first P-type transistor;
the second circuit element includes a drain of a first N-type transistor;
the third circuit element includes a gate of a second P-type transistor;
the fourth circuit element includes a gate of a second N-type transistor;
the first P-type transistor and the first N-type transistor are part of a first inverter; and
the second P-type transistor and the second N-type transistor are part of a second inverter.

16. The method of claim 9, wherein the predetermined distance includes at least one of:
a predetermined width of a metal structure in a semiconductor structure;
a predetermined width of a gate structure in the semiconductor structure;
a predetermined width between the metal structure and the gate structure;
a predetermined minimum width between two metal structures; or
a predetermined width between the two metal structures.

17. A method, comprising:
fabricating, by a first mask, a first set of conductive lines having a first dimension;
fabricating, by a second mask, a second set of conductive lines having a second dimension, the first dimension being different from the second dimension; and
fabricating, by the first mask, a third set of conductive lines of a first circuit and a fourth set of conductive lines of a second circuit,
wherein the first circuit is similar to the second circuit, each conductive line of the third set of conductive lines corresponds to each conductive line of the fourth set of conductive lines, and each conductive line of the third set of conductive lines is configured to carry a corresponding first current.

18. The method of claim 17, wherein
the first circuit and the second circuit are each part of a same symmetrical circuit.

19. The method of claim 17, further comprising:
fabricating, by the second mask, a fifth set of conductive lines of the first circuit and a sixth set of conductive lines of the second circuit,
wherein each conductive line of the fifth set of conductive lines corresponds to each conductive line of the sixth set of conductive lines, and each conductive line of the fifth set of conductive lines of the first circuit is configured to carry a corresponding second current, a value of the first current is greater than a value of the second current.

20. The method of claim 18, wherein the first circuit is part of a current mirror, and the second circuit is part of the current mirror.

* * * * *